(12) United States Patent
Lazar et al.

(10) Patent No.: US 6,741,515 B2
(45) Date of Patent: May 25, 2004

(54) DRAM WITH TOTAL SELF REFRESH AND CONTROL CIRCUIT

(75) Inventors: Paul S. Lazar, Santa Clara, CA (US); Seung Cheol Oh, Cupertino, CA (US)

(73) Assignee: Nanoamp Solutions, Inc., San Jose, CA (US)

( * ) Notice: Subject to any disclaimer, the term of this patent is extended or adjusted under 35 U.S.C. 154(b) by 130 days.

(21) Appl. No.: 10/174,867

(22) Filed: Jun. 18, 2002

(65) Prior Publication Data

US 2003/0231540 A1 Dec. 18, 2003

(51) Int. Cl.[7] .................................................. G11C 7/00
(52) U.S. Cl. ........................ 365/222; 365/222; 365/227
(58) Field of Search ................................. 365/222, 227, 365/230.03, 149, 200, 189.02, 193, 226

(56) References Cited

U.S. PATENT DOCUMENTS 5,262,998 A * 11/1993 Mnich et al. ............... 365/222
5,596,545 A    1/1997  Lin
5,835,401 A   11/1998  Green et al.
5,999,474 A   12/1999  Leung et al.

* cited by examiner

Primary Examiner—David Nelms
Assistant Examiner—Thinh T Nguyen
(74) Attorney, Agent, or Firm—Patrick T. King

(57) ABSTRACT

Internally refreshing one or more DRAM arrays without requiring additional external command signals. Scheduling of either refresh cycles and/or read/write access cycles uses an arbitration and selection circuit that receives a refresh request input signal from an independent oscillator and a row access select RAS input signal. A wordline address multiplexer provides either internally-provided refresh or externally-provided row-line address signals to a wordline decoder. A refresh row counter uses a token status signal for activating only one refresh row counter at a time. Instantaneous refresh power is controlled by controlling the number of cells in each DRAM block. An arbitration and control system includes an address transition block with a delay for resolving metastability, a refresh control block, a RAS control block, and an arbitration circuit that temporarily stores unselected requests.

32 Claims, 22 Drawing Sheets

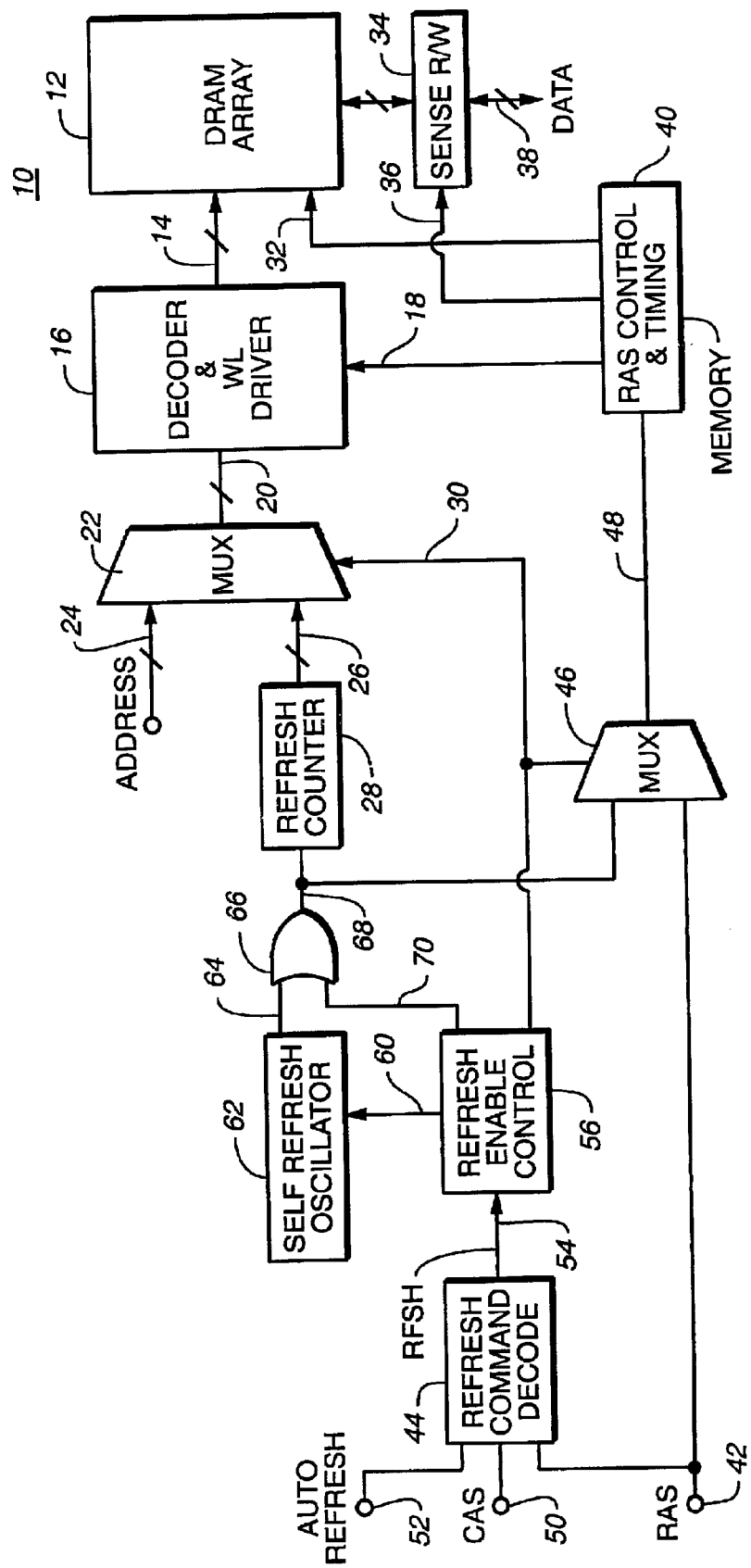
FIG._1
(PRIOR ART)

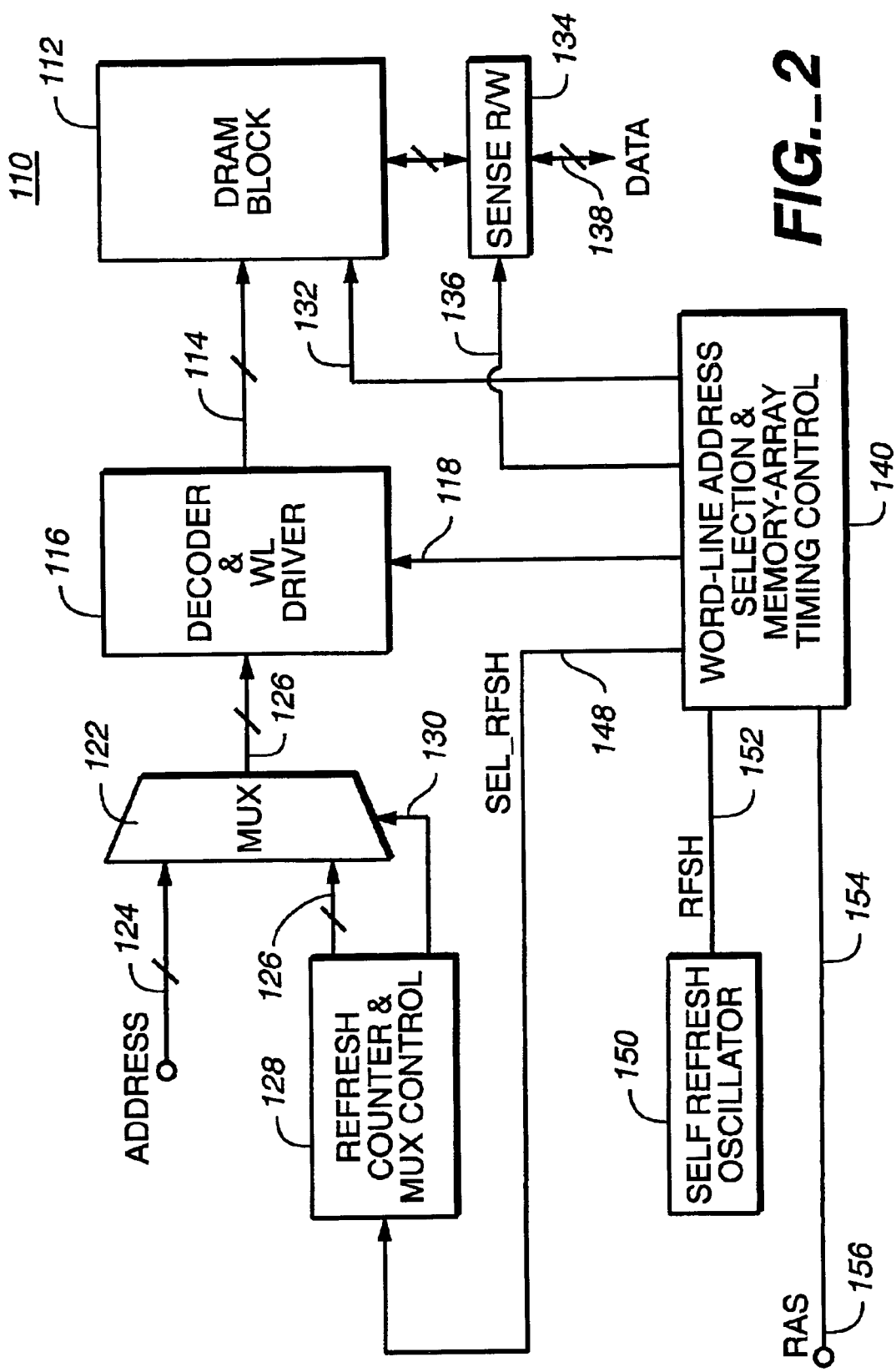
FIG._2

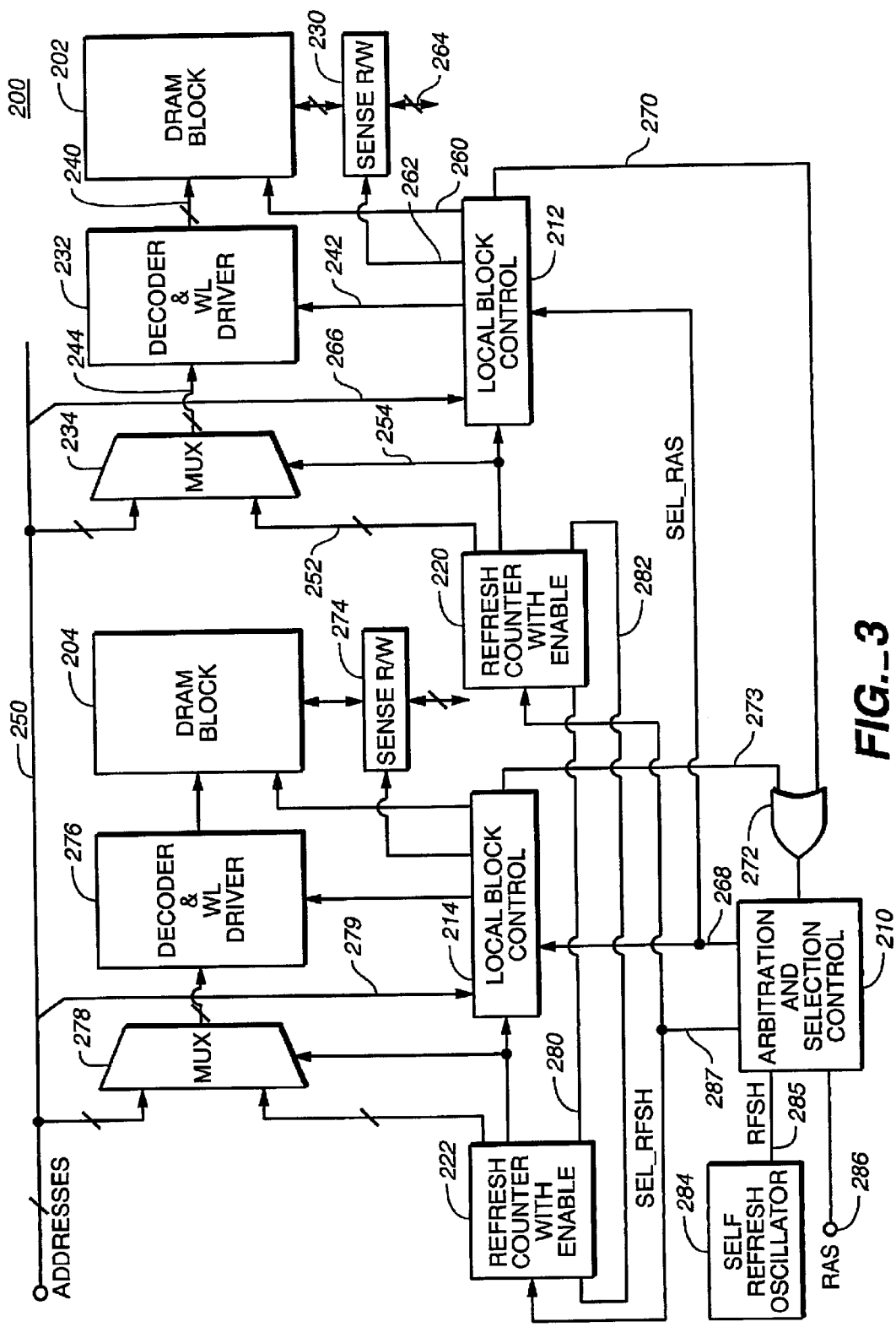
FIG._3

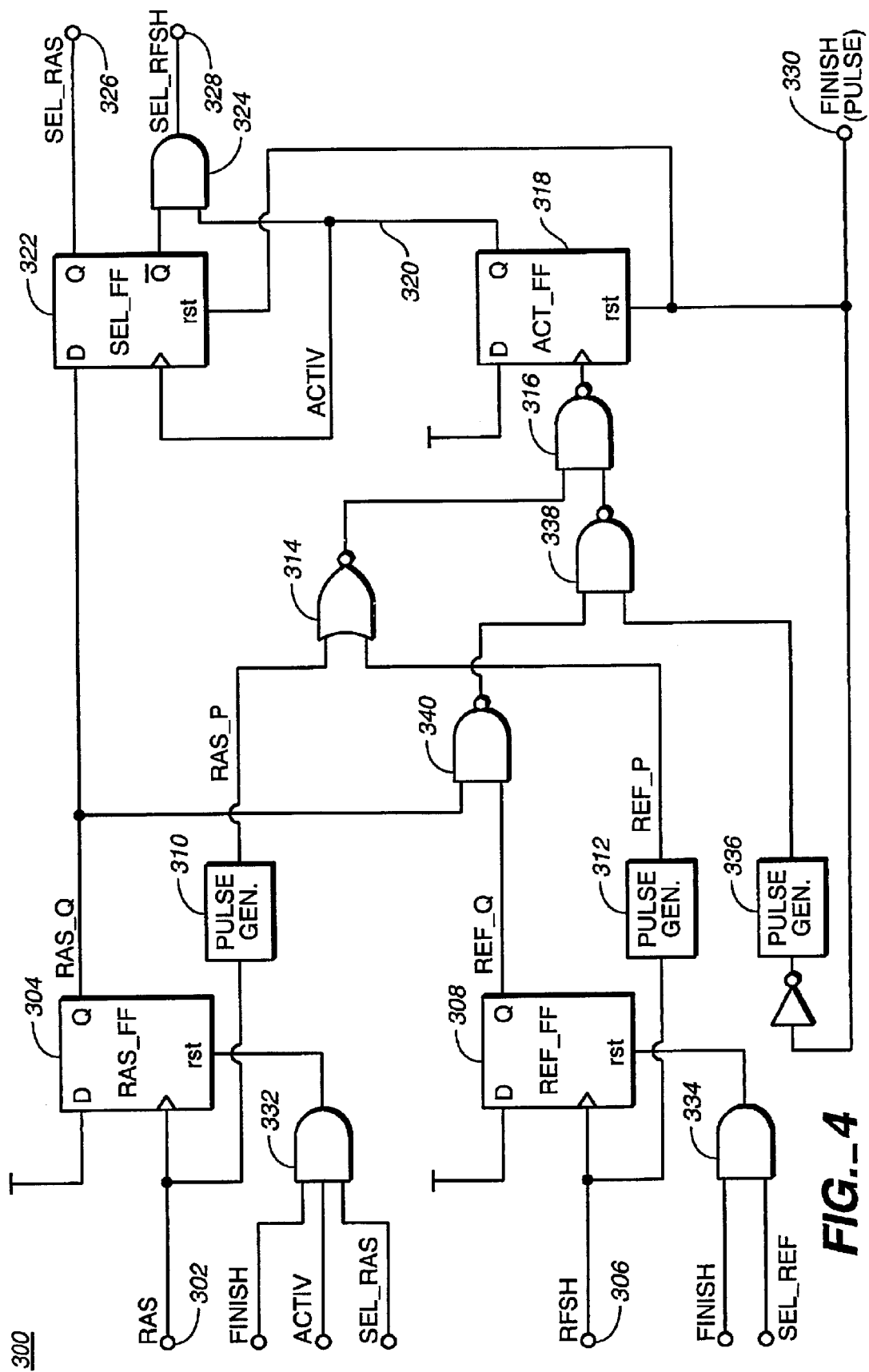
FIG._4

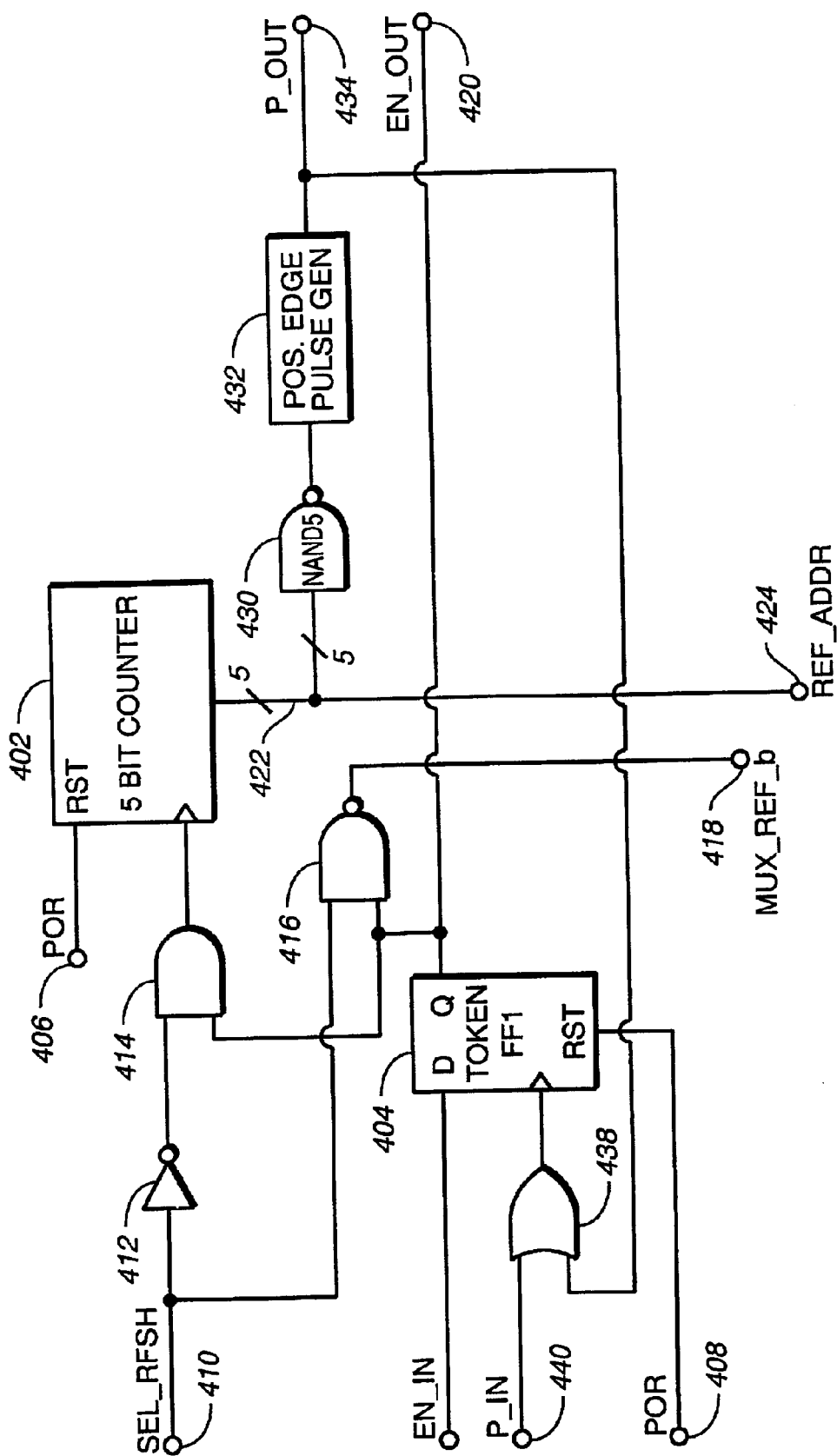
FIG._5

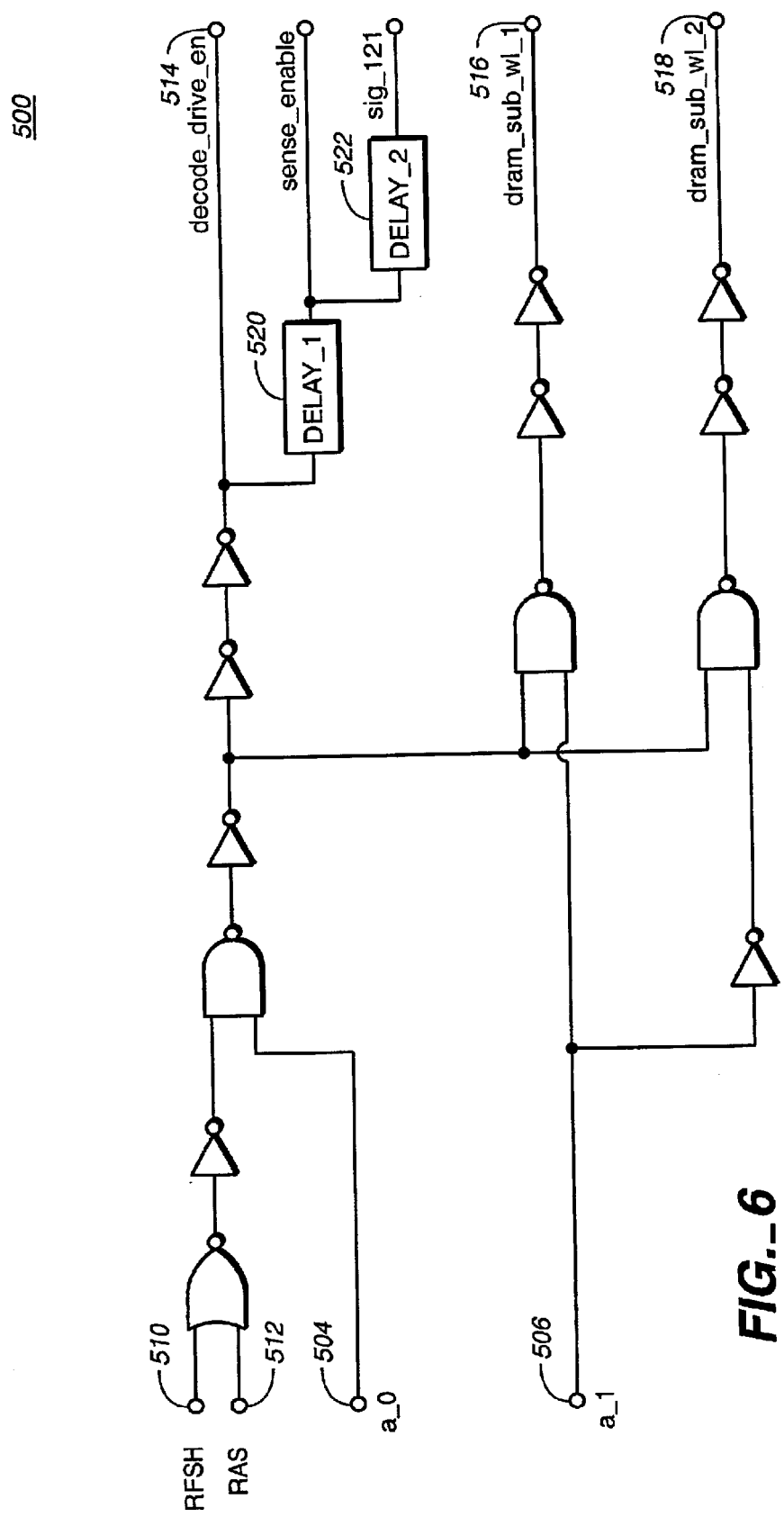
FIG._6

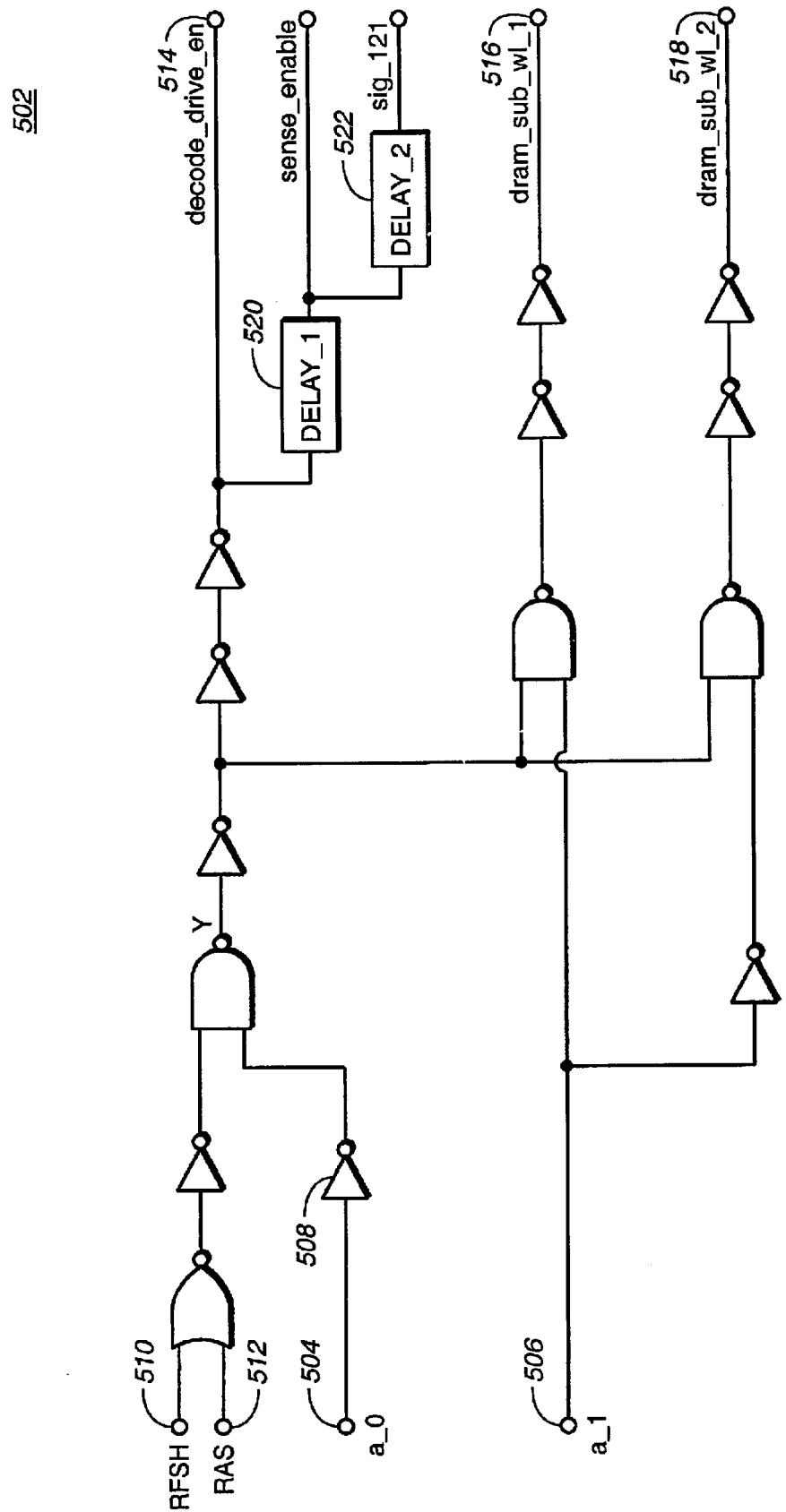
FIG._7

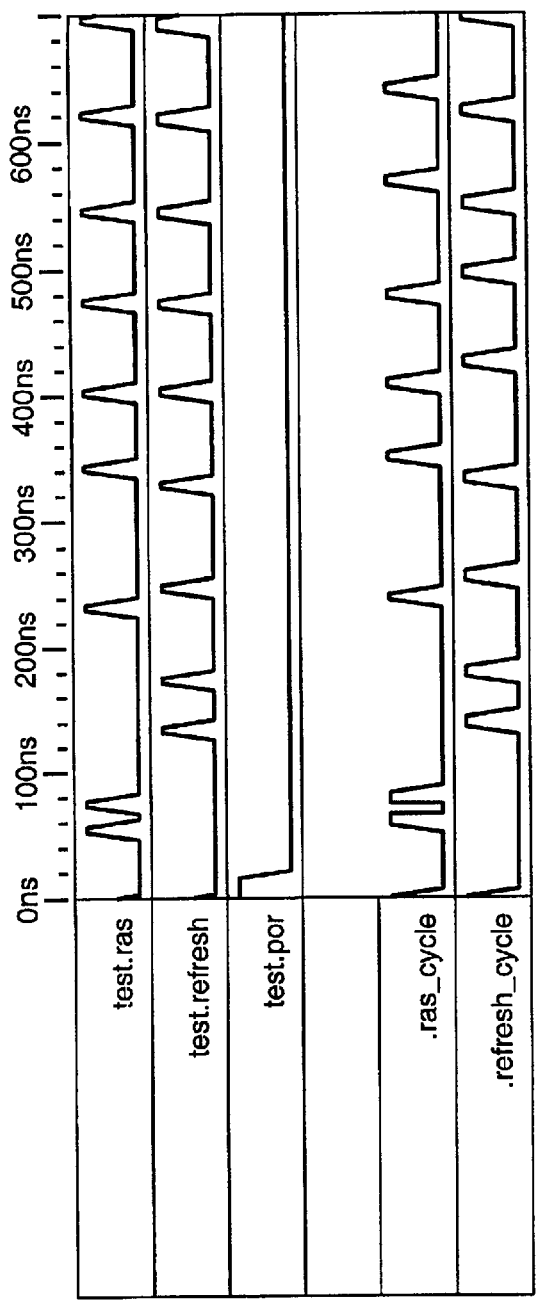
FIG._8
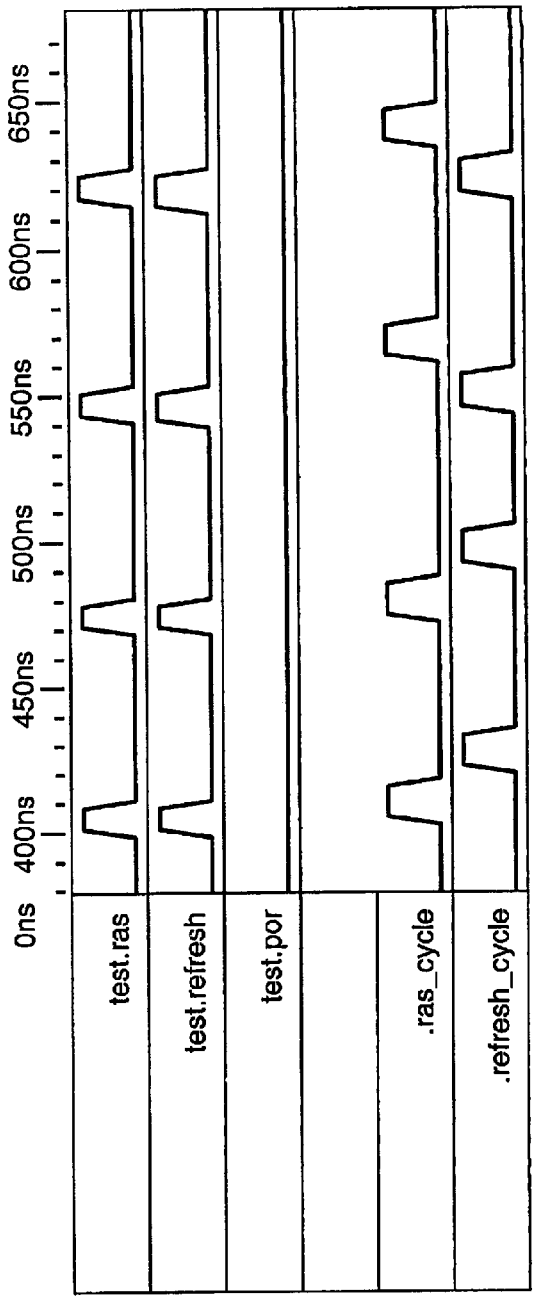
FIG._9

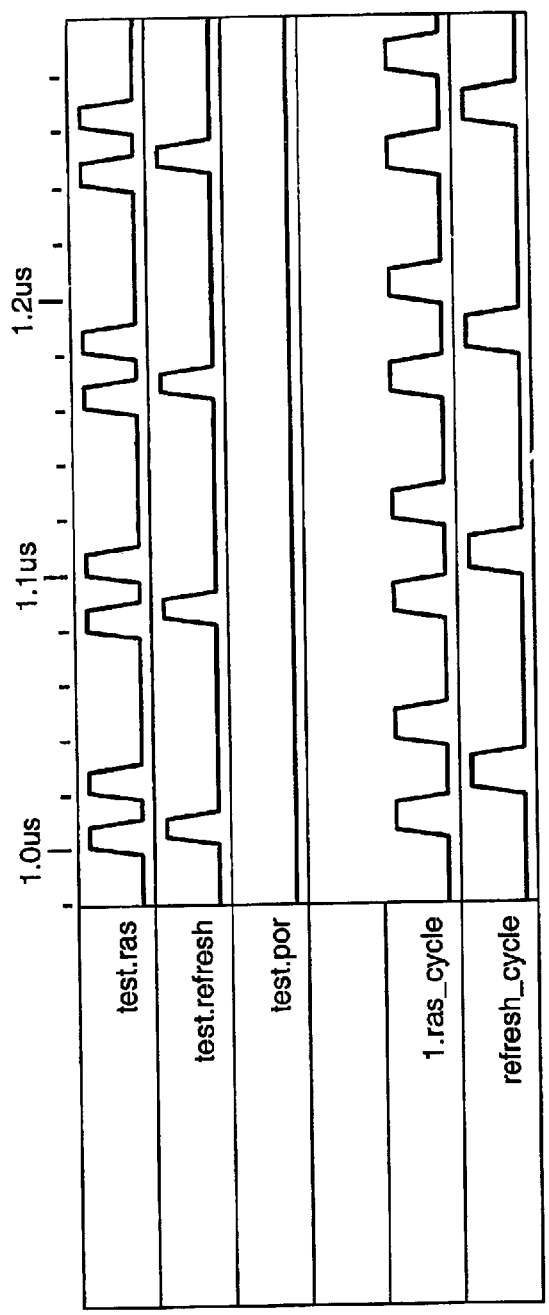
FIG._10
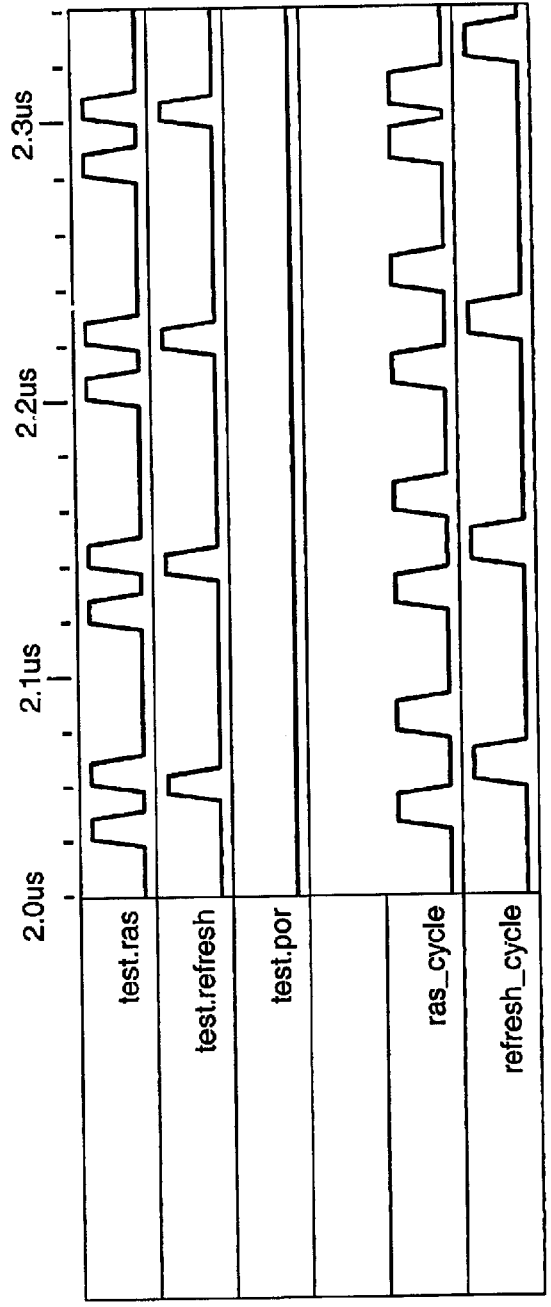
FIG._11

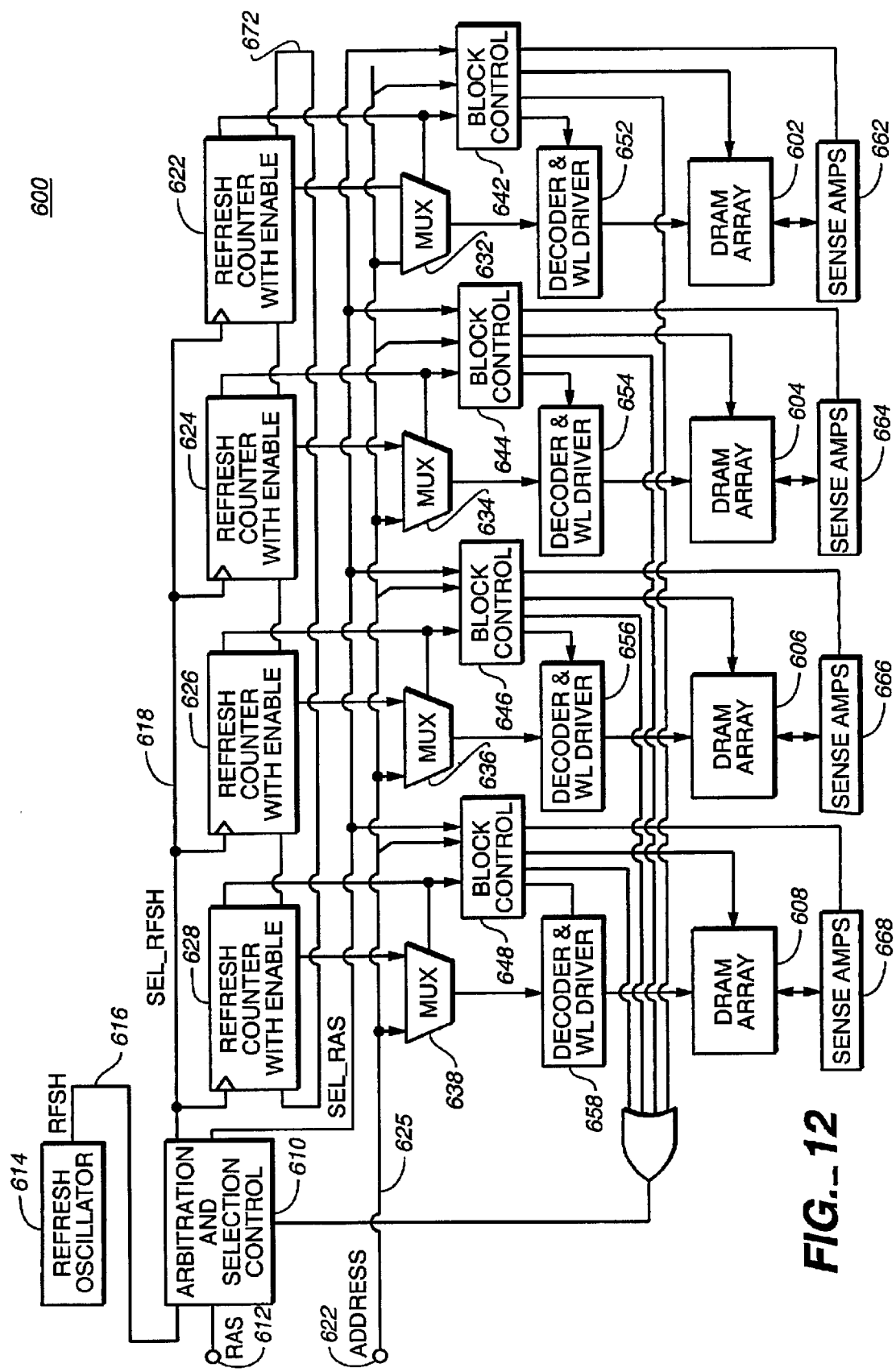
FIG._12

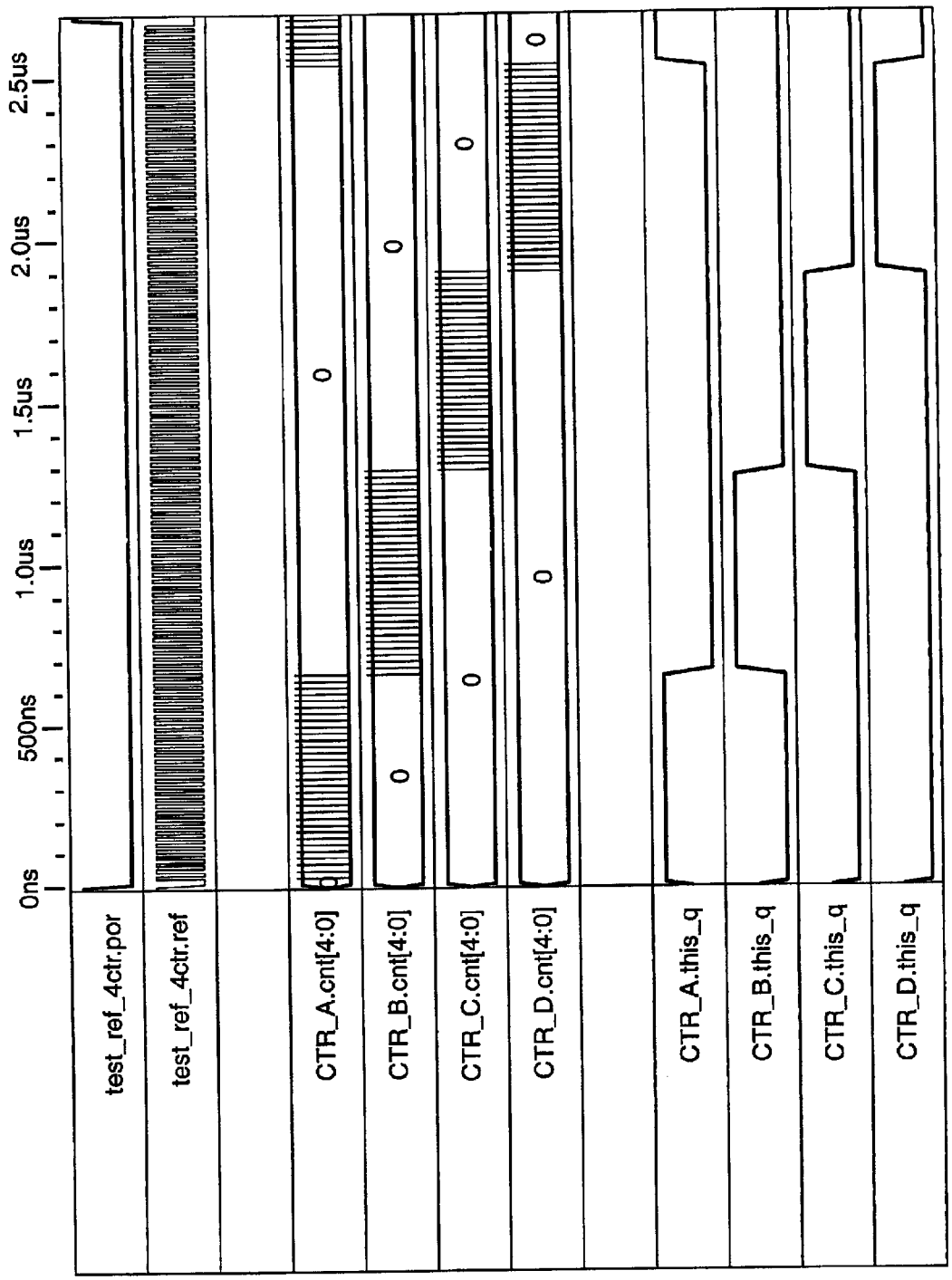
FIG._13

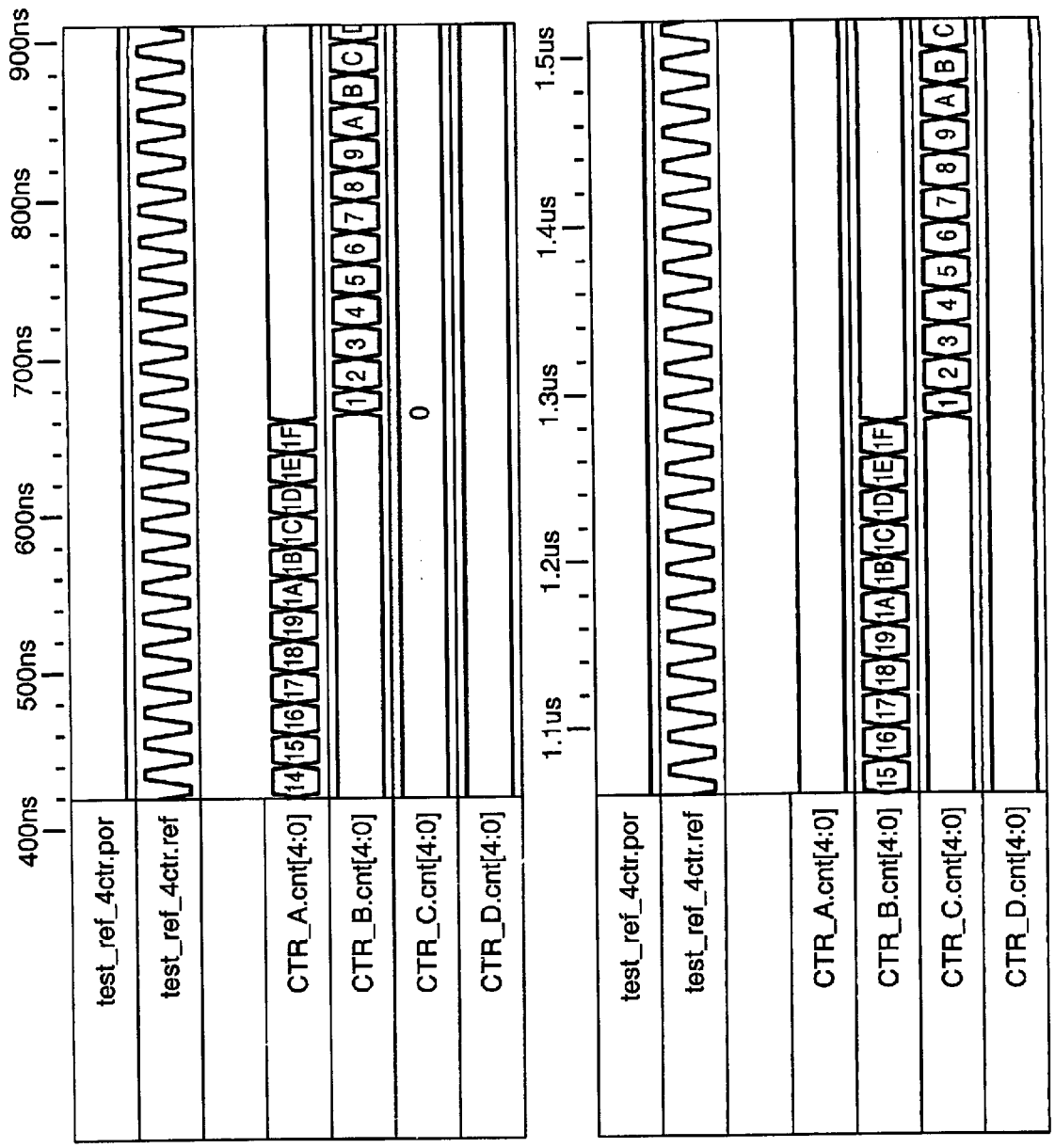
FIG._14
FIG._15

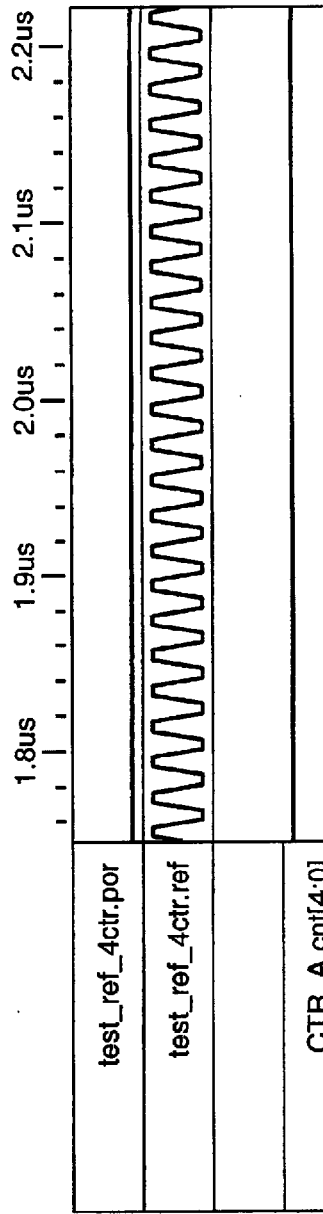
FIG._16
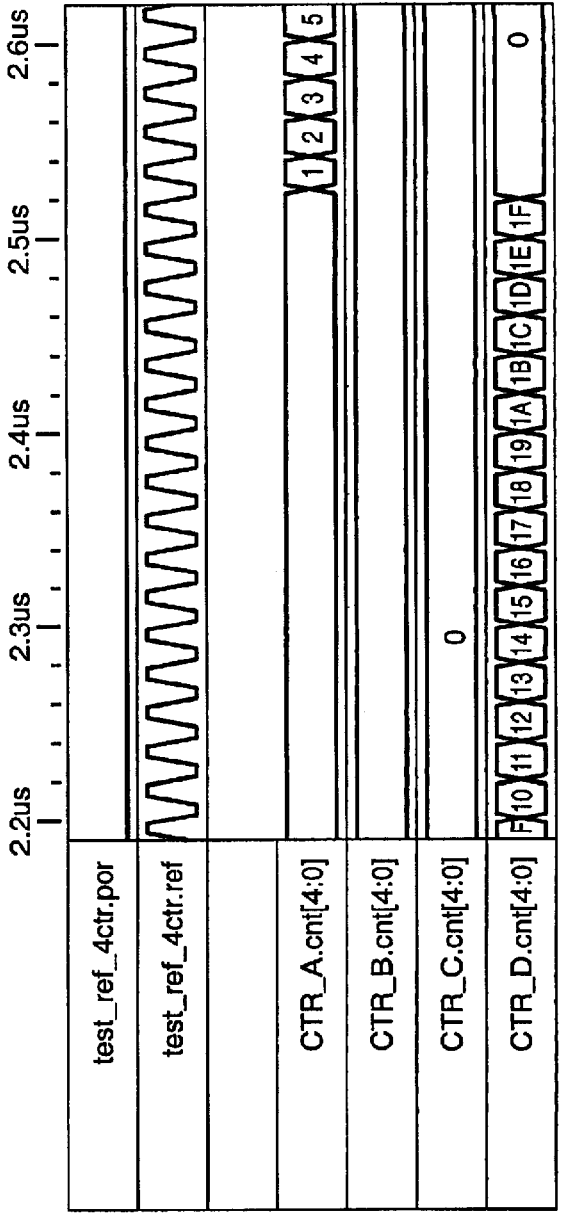
FIG._17

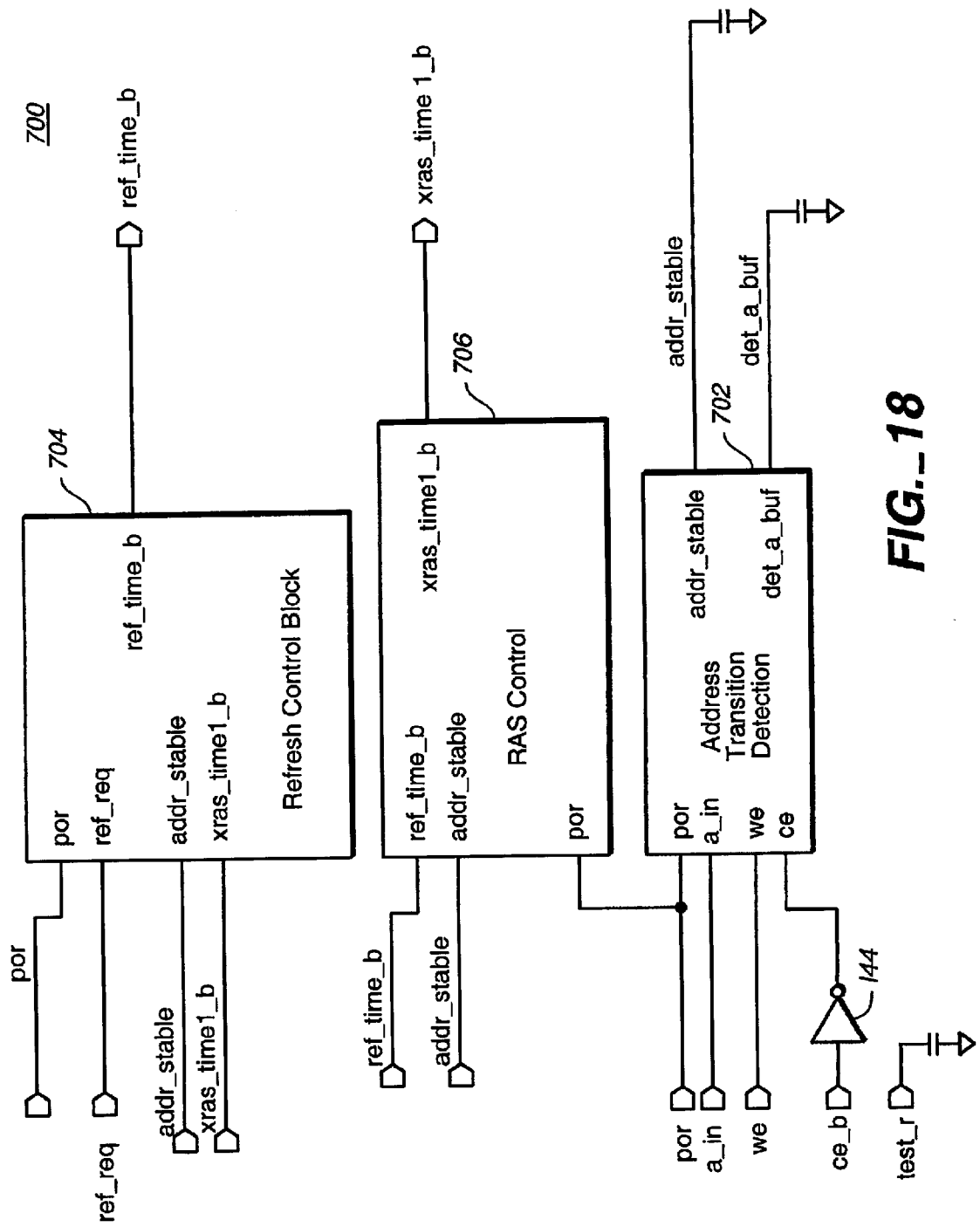
FIG._18

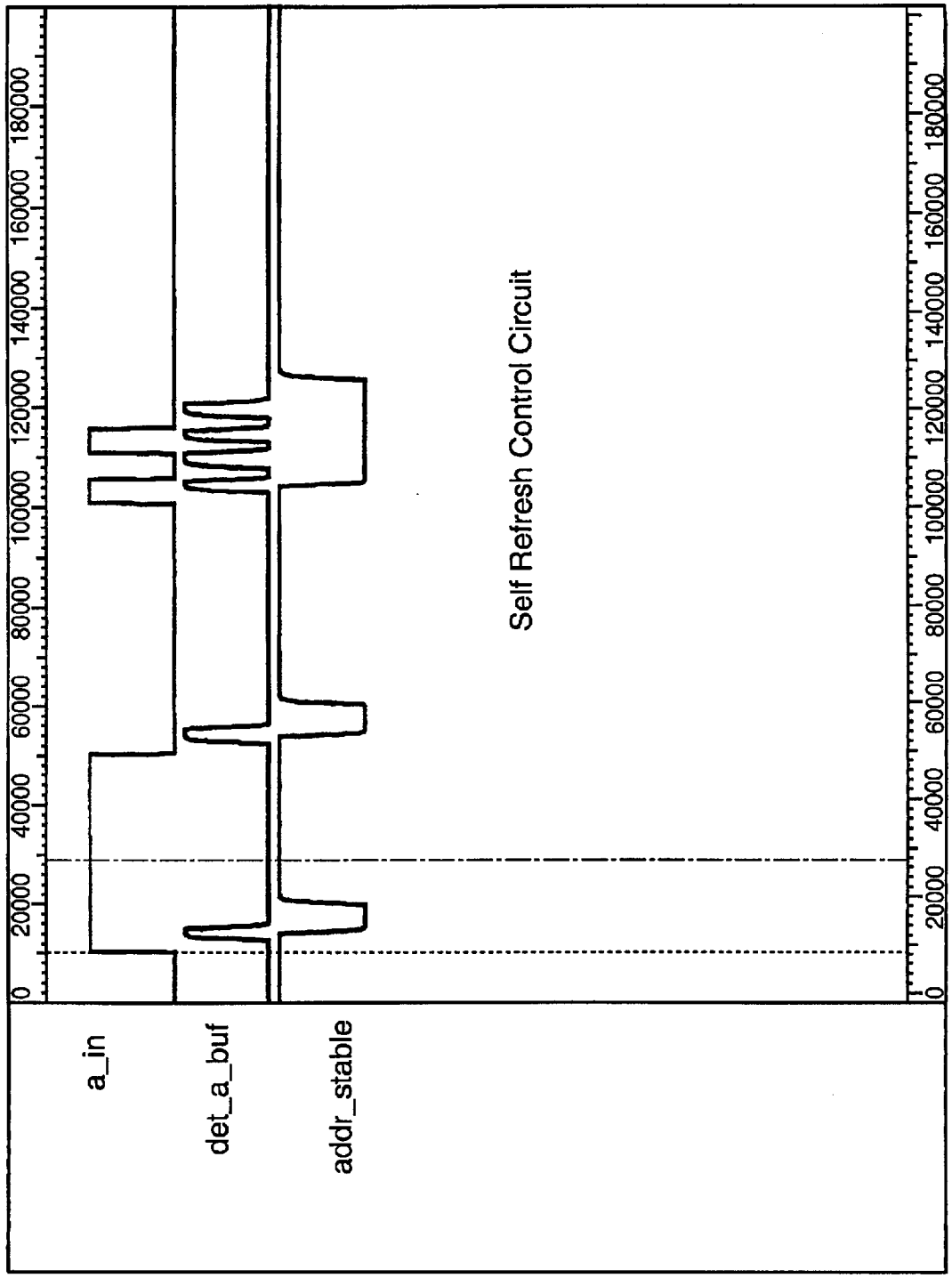
FIG._19

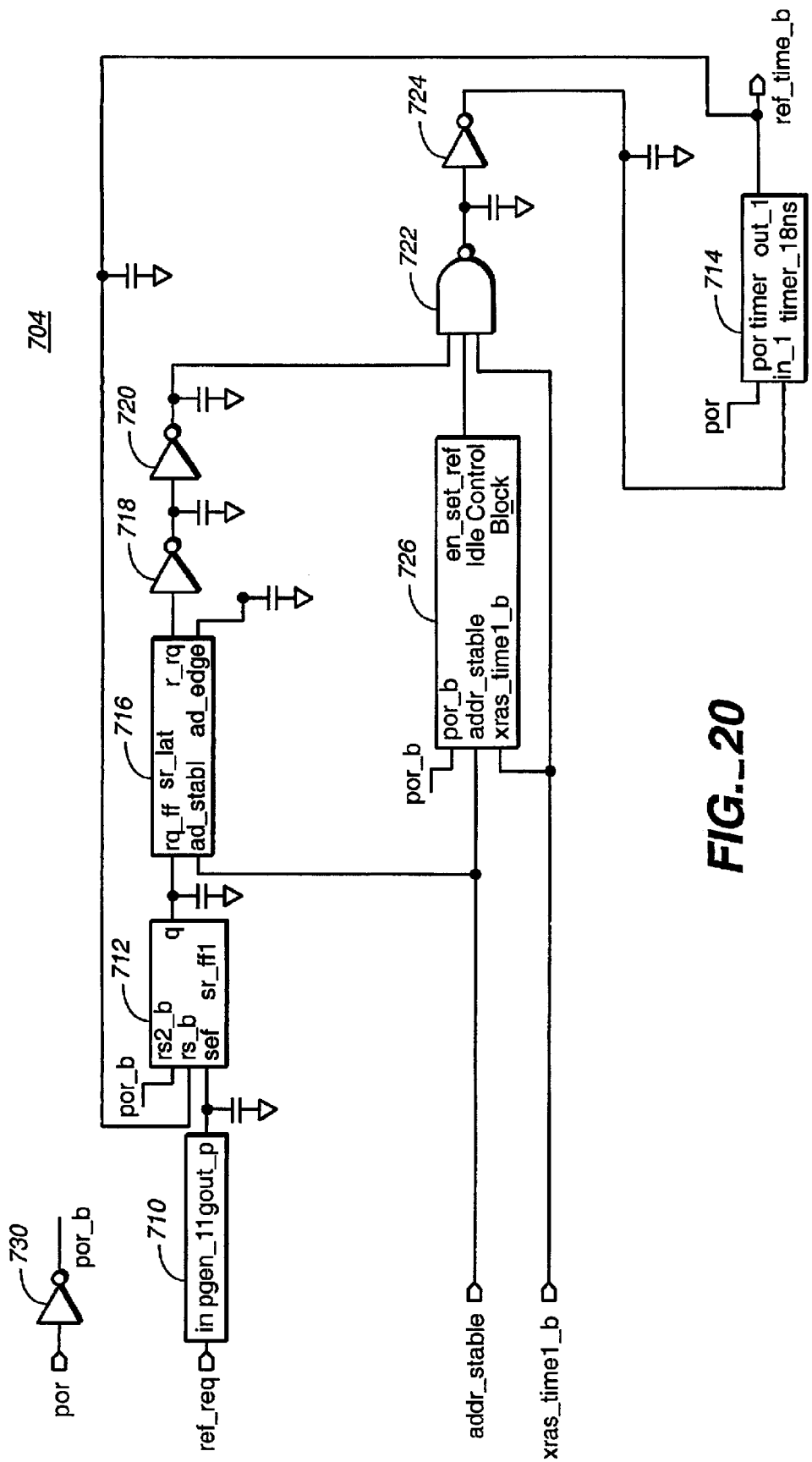
FIG._20

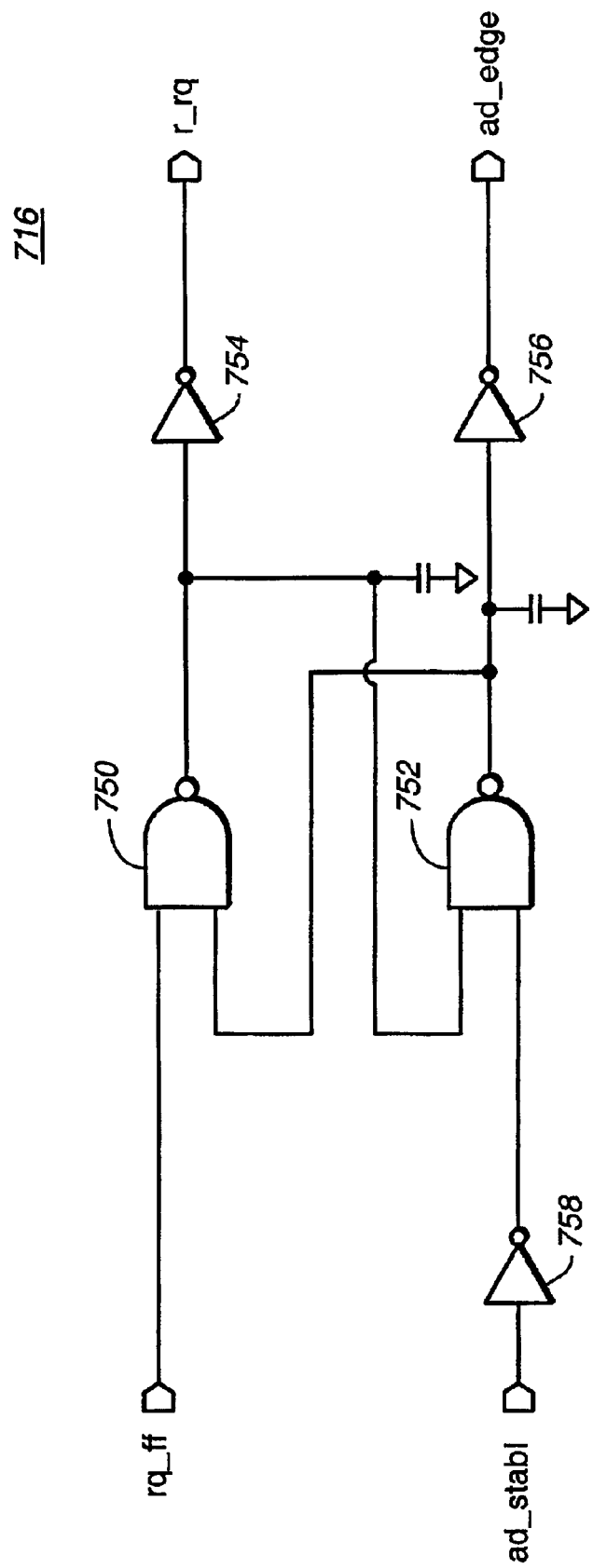
FIG._21

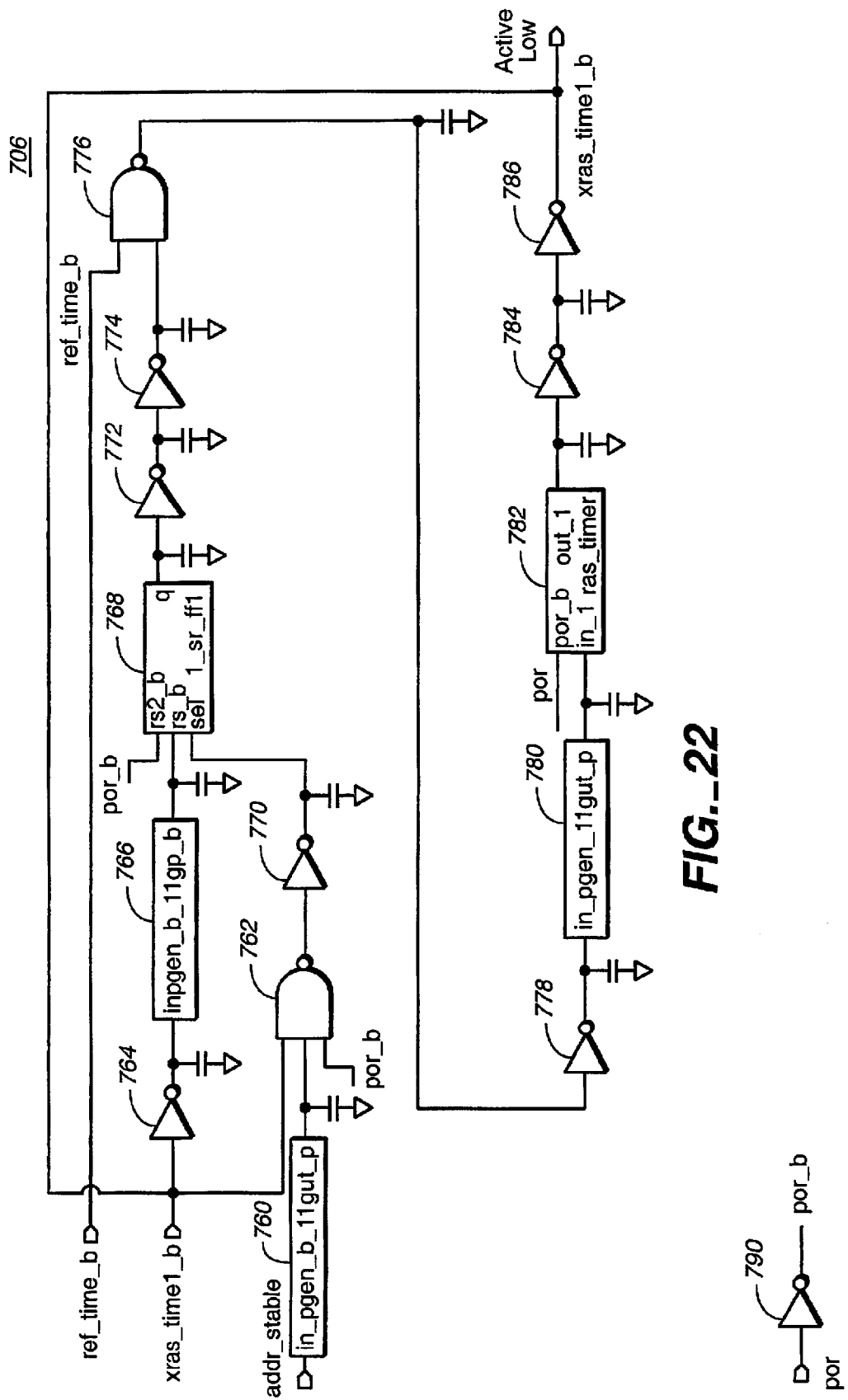
FIG._22

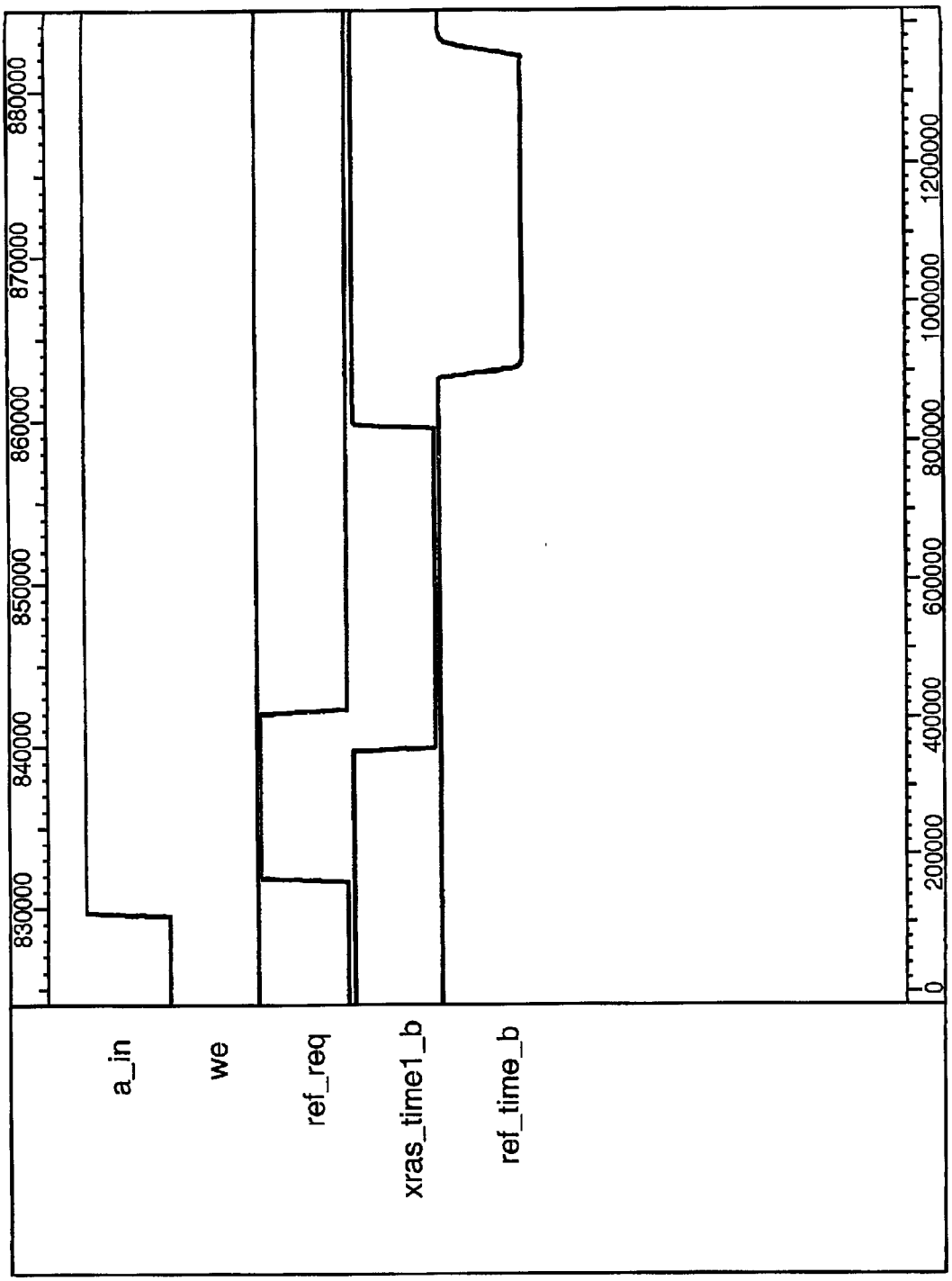
FIG._23

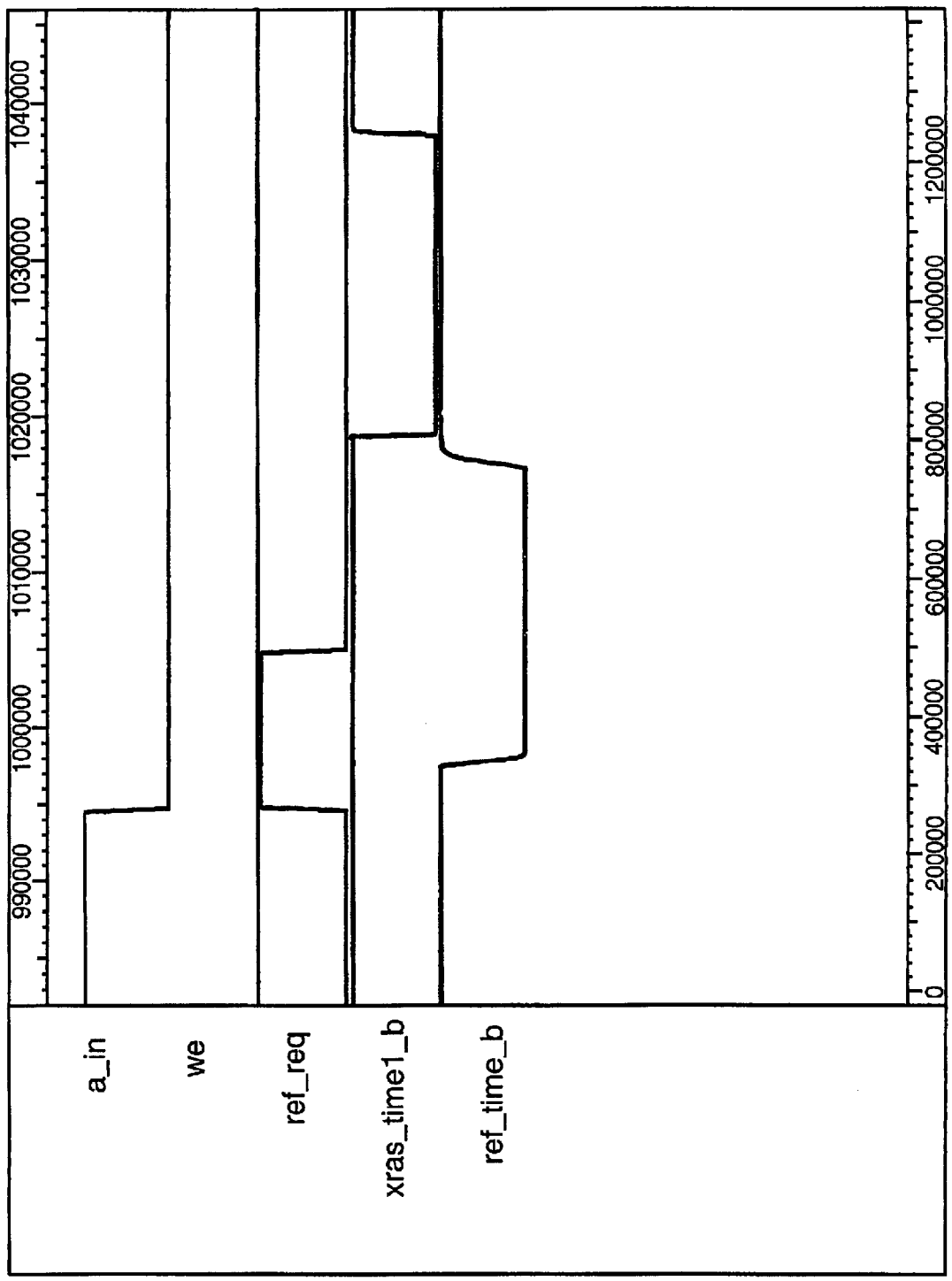
FIG._24

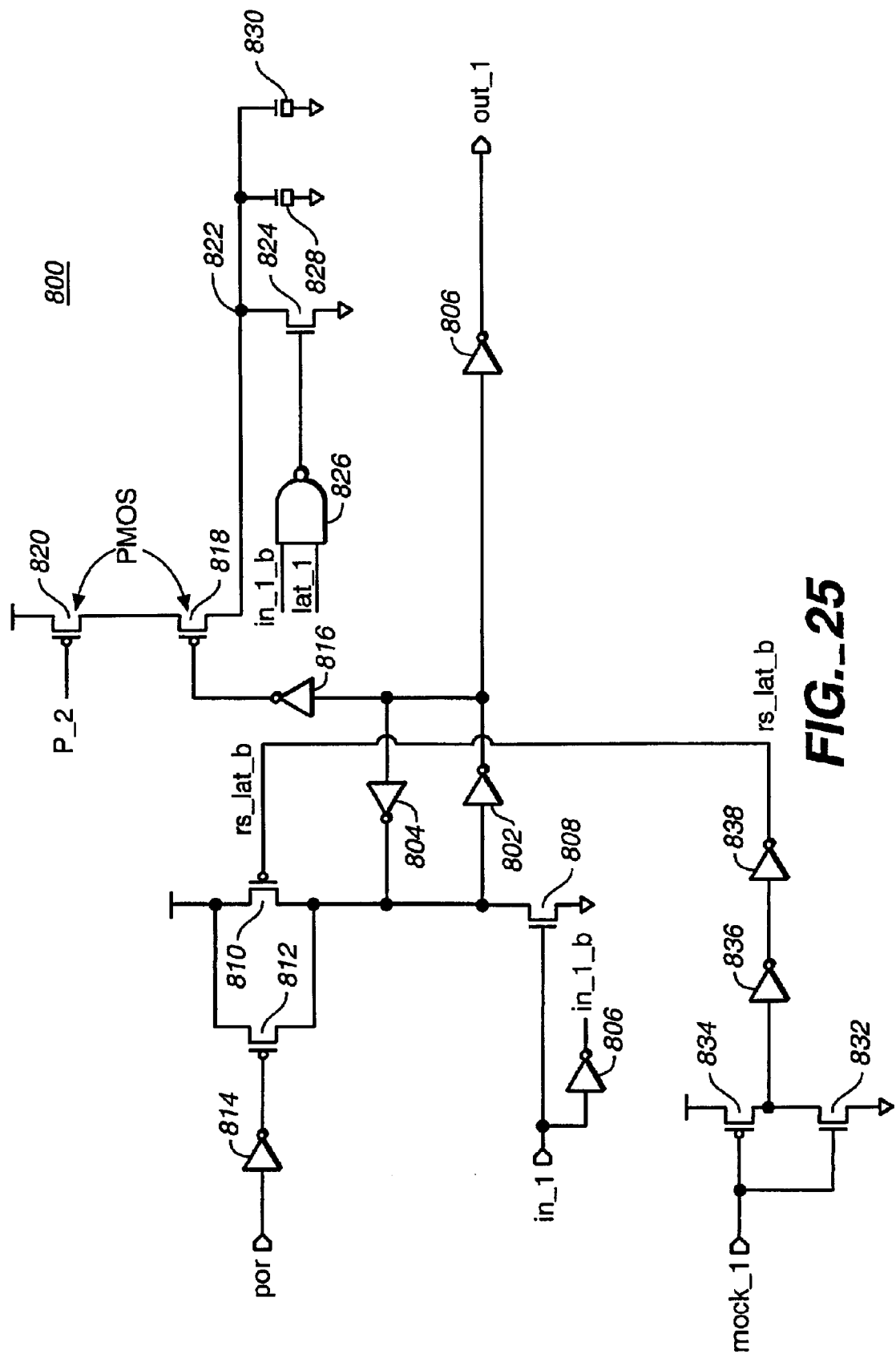
FIG._25

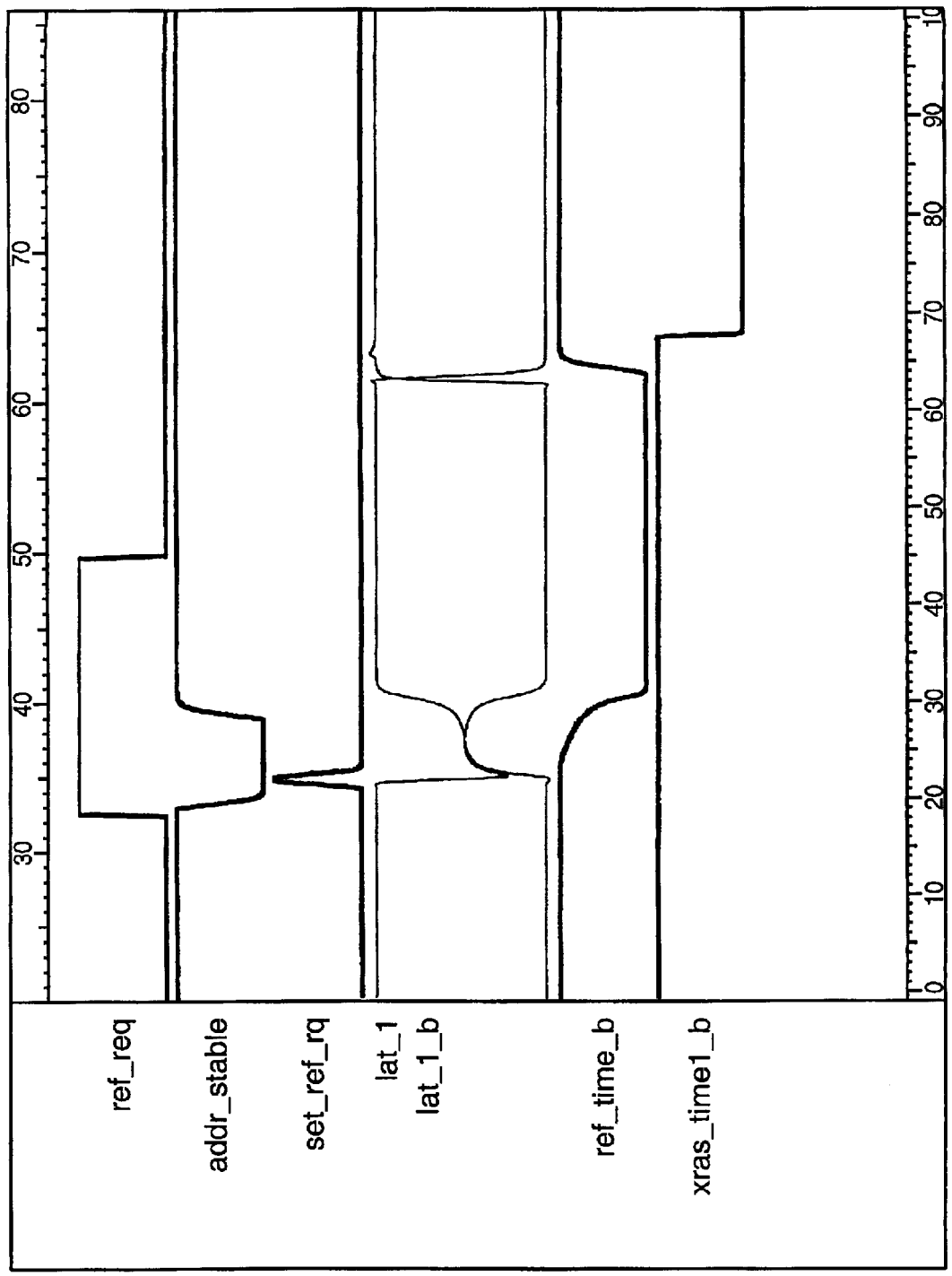
FIG._26

DRAM WITH TOTAL SELF REFRESH AND CONTROL CIRCUIT

BACKGROUND OF THE INVENTION

1. Field of the Invention

This invention relates to dynamic random access memories (DRAMs) and, more particularly, to an improved technique for refreshing DRAM memory cells.

2. Prior Art

Data is stored in a DRAM memory storage cell using charge that is stored on a capacitor in each memory storage cell. The presence or absence of stored charge represents either a one or a zero bit in a memory cell. The stored charge leaks away through various leakage mechanisms, and over time, the data represented by the charge is lost unless the charge stored in the memory storage cell is periodically refreshed with a refresh circuit to restore the charge. Because of this leakage, a refresh operation is typically required every 64 milliseconds. The need for a periodic refresh operation affects both external interface functions and control functions of the DRAM. DRAMs are constructed such that whenever a row of a DRAM is addressed, the memory storage cells in that row are automatically refreshed, regardless of whether the row addressing is for a READ, A WRITE, or a REFRESH operation.

The timing signals for an asynchronous DRAM are not synchronized to a system clock. An asynchronous DRAM is provided with an external row address select (RAS) command signal and with an external column address select (CAS) signal. During normal operation of an asynchronous DRAM, a RAS signal occurs before a CAS signal. In order to perform a typical refresh operation in an asynchronous DRAM, a CAS signal occurs before a RAS signal.

The timing signals for a synchronous DRAM are synchronized to a system clock so that timing is better controlled and the DRAM can operate at higher speeds. In an synchronous DRAM, an address strobe signal is generated when an address signal level transition is detected in one or more address signal lines. The first part of the address is a row address and the second part of the address is a column address that is provided after one or more clock pulses. RAS and CAS signals are generated in a synchronous DRAM and used with an auto-refresh command to refresh the charge in the memory cells.

Alternatively, many types of conventional asynchronous and synchronous DRAMs are refreshed by being placed in a standby mode with an external command. In the standby mode, a memory cell refresh is performed internally and this type of refreshing is referred to as a "self refresh."

Various prior art schemes have been disclosed for hiding an internal refresh operation in a DRAM. These types of prior art schemes generally add more complexity to a DRAM to obtain higher speeds and better performance, whereas low power and reductions of circuit complexity and circuit area are usually desired for a DRAM.

One such prior art scheme is disclosed in a U.S. Pat. No. 5,999,474, granted to Leung et al. The '474 apparatus uses an SRAM cache and an associated cache tag memory, where the SRAM cache has a storage capacity that is 1/64th of the storage capacity of the DRAM. The SRAM cache has two separate very wide 256-bit read and write data buses. One disadvantage of the disclosed '474 apparatus is the large amount of circuit area is required by the SRAM cache. Since SRAM cache cells typically use 9 to 10 times the area of a DRAM memory cell, the additional area required for '474 apparatus is close to 15% of the area used for the DRAM memory arrays. Another disadvantage of the disclosed '474 apparatus is the need for the two separate wide data buses that are used to write and to read a cache line. This makes power consumption for the disclosed '474 apparatus dependent on the cache hit profile, which can result in high peak power and in high sustained power for certain situations.

Another prior art scheme is disclosed in a U.S. Pat. No. 5,596,545, granted to Lin for a semiconductor device with internal self-refreshing. The '545 apparatus uses a comparator to detect when there is a conflict between a refresh operation and a write operation. The comparator consumes silicon area and power unnecessarily and provides no performance advantage.

Another such prior art scheme is disclosed in a U.S. Pat. No. 5,835,401, granted to Green et. al. that describes a circuit for hiding a refresh operation of DRAM cells in a memory device. The '401 apparatus uses a shift register to speed up the generation of the refresh address. The '401 apparatus also requires either an external CLK signal or an external CE* signal to control the refresh operation. The disadvantages of the '401 apparatus are the increased silicon area required for the shift register and the need for an external CLK or CE signal to initiate the refresh operation.

FIG. 1 illustrates a generic DRAM system 10 that is shown to illustrate refreshing of either an asynchronous DRAM or a synchronous DRAM. The generic DRAM system 10 includes a DRAM memory cell array, or block, 12 that is arranged as rows and columns of memory cells. While a single DRAM array 12 is shown, it is understood that in a conventional DRAM there are typically several arrays of DRAM memory cells and these arrays are arranged as a set of several banks of memory cells. Individual rows of the DRAM array 12 are selected with a corresponding wordline, or row select, signal that is provided on one of a plurality of wordlines that are provided in a wordline bus 14. The wordline signals are provided from a decoder/wordline driver circuit 16 that is activated by a decoder control signal on a control line 18. Multi-bit address signals are inputted on a multi-line bus 20 to the decoder/wordline driver circuit 16 from a two-input multiplexer circuit 22. The two-input multiplexer circuit 22 selects external address signals from a multi-line memory address bus 24 or internal address signals on a multi-line bus 26 from a multi-bit refresh counter 28. Selection of the output of the multiplexer 22 is controlled by a multiplexer control signal that is provided on a control line 30.

The DRAM array 12 is enabled with an array enable signal that is provided on a signal line 32. A sense amplifier/read-write circuit 34 for data in and out of the DRAM array 12 is controlled by a memory read-write control signal on a control line 36. For reading out data stored in one of the memory cells in the array 12, the sense amplifier is used to detect the charge level in that memory cells to provide an output data bit on an I/O bus 38. For writing data into one of the memory cells, input data is read into the memory cells of the array 12 from the I/O bus 38.

A RAS control and memory timing circuit 40 provides the decoder control signal on control line 18. The RAS control and memory timing circuit 40 provides the array enable signal on the signal line 32. The RAS control and memory timing circuit 40 also provides the memory read-write control signal on the control line 36.

For both asynchronous and synchronous types of DRAMS, an external RAS signal is provided at a RAS input terminal 42. The RAS input terminal 42 is connected to an input terminal of a refresh command decode circuit 44 and is also connected to one input terminal of a two-input multiplexer 46. For normal memory-access operations of the memory array 12, that is, for read or write operations, the RAS signal is passed through the two-input multiplexer 46 to a signal line 48 that is connected to an input terminal of the RAS control and memory timing circuit 40. This RAS signal produces appropriate control signals on control line 18, 32, and 36, as previously mentioned.

For an asynchronous DRAM, an external CAS signal is provided at a CAS input terminal 50 of the refresh command decode circuit 44. For a synchronous DRAM, an external AUTO REFRESH signal is also provided at an AUTO REFRESH input terminal 52 of the refresh command decode circuit 44. During a normal memory-access operation of an asynchronous DRAM, a RAS signal is presented to input terminal 42 before a CAS signal is presented to CAS input terminal 50. To initiate a refresh operation in a typical asynchronous DRAM the sequence of RAS and CAS signals is reversed so that a CAS signal is presented to CAS input terminal 50 before a RAS signal is presented to RAS input terminal 42. This CAS-before-RAS refresh sequence is detected by the refresh command decode circuit 44 to produce a refresh RFSH output signal on an output signal line 54 of the refresh command decode circuit 44.

For a synchronous DRAM, a refresh operation is initiated when an AUTO REFRESH command signal is received at input terminal 52 of the refresh command decode circuit 44 to produce a refresh RFSH output signal on signal line 54. The RFSH signal on line 54 activates a refresh enable circuit 56. The activated refresh enable control circuit 56 provides three output signals as follows: An oscillator enable signal is provided on a signal line 60 to turn on a self refresh oscillator circuit 62. An output signal from the self-refresh oscillator 62 is provided on a signal line 64 to one input terminal of a two-input OR gate 66 that has its output terminal connected with a signal line 68 to an input terminal of the refresh counter 28. The refresh counter 28 keeps track of the memory word line that is being refreshed in the self-refresh mode. The refresh enable control circuit 56 also provides a pulse on a signal line 70 at the end of a refresh cycle to another input terminal of the two-input OR gate 66 in order to increment the refresh counter 28 to the address of the next wordline to be refreshed in the self-refresh mode of operation. The refresh enable control circuit 56 also provides the multiplexer control signal on the control line 30 to select the internal address signals that are provided on the multi-bit bus 26 from the multi-bit refresh counter 28. The multiplexer control signal on the control line 30 is also connected to a control terminal of the two-input multiplexer 46 to provide a self-refresh equivalent RAS signal from the refresh enable control circuit 56 on signal line 48 to the RAS control and timing circuit 40.

It is evident from the operation of the system of FIG. 1 that conventional refresh schemes for both asynchronous and synchronous DRAMS require that external input signals need to be provided and need to be properly decoded prior to initiation of a refresh cycle.

For refreshing an asynchronous DRAM with external RAS and CAS signals, a CAS-before-RAS signal sequence must be decoded by the refresh command decode circuit 54. For refreshing a synchronous DRAM, an external AUTO REFRESH signal needs to be decoded. In both case external signals and signal sequences are required to initiate an internal memory refresh sequence.

For many DRAM applications, it would be advantageous to have a simplified interface and control scheme to provide refreshing for the memory cells without the use of additional external control signals. It would also be advantageous that the circuitry for controlling and for performing DRAM refresh operations be as simple as possible and require a minimum of such circuitry. It would also be advantageous that a DRAM memory be organized so that the refresh function consumes minimal power and is executed within a prescribed period of time. Metastability in decision circuits can cause problems when nearly simultaneous request signal are received. Loss of a non-selected request is also a problem.

Consequently, a need exists for a DRAM device that has a simple external interface that requires no external refresh commands or input signal sequences and that does not lose non-selected refresh or external-access requests. It is desirable that minimal circuitry and minimal power are needed to perform a refresh operations of a DRAM.

SUMMARY OF THE INVENTION

The present invention provides a DRAM with a simple external interface that eliminates the need for any additional external control signal to initiate a refresh operation for the DRAM. The present invention provides a DRAM with reduced power dissipation by a DRAM during a refresh operation by providing that the DRAM is broken into smaller DRAM blocks, or arrays, with fewer memory cells in each DRAM block so that less power is used for each refresh cycle. The present invention reduces the power dissipated by a DRAM when it is in a standby mode when only refresh cycles are being executed by the DRAM. The refresh technique according to the invention internally schedules refresh cycles for completion within a predetermined period of time while performing arbitrary write or read access cycles. The refresh technique according to the invention also internally schedules write or read cycles for completion within a predetermined period of time while performing refresh cycles. For multiple DRAM blocks, scheduling of refresh cycles and/or write or read access cycles uses an arbitration and selection circuit.

One embodiment of a DRAM system according to the invention includes a plurality of DRAM cell blocks, or arrays, with each DRAM block having an associated counter or other refresh address generating means and where only one such counter or address generating means is active during a given refresh cycle.

The present invention provides a memory device which includes one or more DRAM memory cell arrays and a control circuit for accessing and refreshing the DRAM memory cells. The control circuit is coupled to an internal oscillator and executes refresh cycles at times independently determined by the oscillator. The one or more DRAM memory cell arrays are structured so that a row access operation, whether for write, or read, or refresh, consumes relatively little power and may be performed in a relatively short time. This results in the external interface for the DRAM being very simple, similar to that of an SRAM because no external signals are required for control of a refresh operation. The oscillator frequency is set by design to provide a refresh request signal at predetermined intervals as required by the leakage characteristics of the DRAM cells. This refresh request signal is asynchronous with respect to a row access command that may occur in response to an external write or read access command. The control circuit receives row access commands and refresh requests and schedules corresponding operations as these commands occur. If a refresh operation is in progress and a row access command is initiated, the row access operation is delayed until the refresh operation is completed. If a row access operation is in progress and a refresh request occurs, the refresh is delayed until the row access is completed. If both a row access and a refresh occur effectively simultaneously, the row access operation is given priority and the refresh operation is scheduled to begin upon completion of the row access operation.

Each refresh counter has associated with it an enable flip-flop which serves both to enable the local counting and to enable refresh of the associated array. Thus, only one counter is incremented at any given time and only one memory array is refreshed in response to a refresh request. The enable flip-flops are so connected that once a given counter completes its count, a subsequent enable flip-flop is set to thereby enable a subsequent counter. The enable flip-flop for the current counter is cleared to thereby prevent the current counter from further counting until its enable flip-flop is next set.

Although a DRAM is preferably organized as several DRAM blocks, or arrays, to reduce the amount of switching activity and hence the power dissipation, the control circuit may also be coupled to only one memory array or several control circuits may be used, where each control circuit is coupled to its associated set of memory arrays.

One embodiment of the present invention provides a DRAM system with internal refreshing of memory cells. This embodiment is for a single DRAM array of memory cells arranged in word rows where each word row has a row access line for receiving a row line select signal that refreshes DRAM memory cells in the word row. A wordline decoder receives multi-bit row-line address signals and provides row-line select signals to corresponding row access signal lines. A wordline address multiplexer receives a mux control signal to provide internally-provided refresh wordline input address signals to the wordline decoder; the wordline address multiplexer otherwise provides externally-provided row-line address signals to the wordline decoder. A self refresh internal oscillator circuit provides an internal self-refresh RFSH output signal. A row-access-select RAS input terminal receives a row access select RAS input signal for the DRAM array. An arbitration and selection circuit receives the RFSH signal and an input RAS signal and provides a refresh selection SEL_RFSH command output signal to initiate an internal memory-cell refresh cycle when the RFSH input signal is selected and given priority by the arbitration and selection circuit. The arbitration and selection circuit provides a RAS selection SEL_RAS command output signal to initiate a read or write memory-cell cycle when the RAS input signal is selected and given priority by the arbitration and selection circuit. A memory array timing circuit is activated by the SEL_RFSH signal or the RAS signal to provide enable signals for the DRAM array and the wordline decoder. The memory array timing circuit also providing the mux control signal to the wordline address multiplexer to select the internal refresh counter internal wordline address signals. A refresh counter is incremented by the SEL_RFSH signal and provides the internal refresh counter internal wordline address signals REF_ADDR signals to the wordline address multiplexer. Internal refreshing of the DRAM memory cells requires no additional external control signals for internally refreshing the DRAM array. The DRAM system of this embodiment may also include DRAM arrays of DRAM memory cells where each array has an associated refresh counter and where only one such associated refresh counter is active during a given refresh cycle for the DRAM system.

The arbitration and selection circuit internally schedules refresh cycles for completion within a predetermined period of time while performing arbitrary write or read access cycles. The arbitration and selection circuit internally schedules write or read cycles for completion within a predetermined period of time while performing refresh cycles.

Another embodiment of the invention includes two or more DRAM blocks of memory cells, where each DRAM block is arranged in word rows and each of said word rows has a row access signal line for receiving a row-access select signal that causes DRAM memory cells in a corresponding word row to be addressed and refreshed. This DRAM system has a self-refresh internal oscillator circuit that provides an internal self-refresh (RFSH) output signal for the DRAM system. A RAS input terminal receives an input row access select (RAS) signals for the DRAM system. An arbitration and selection circuit that receives the RFSH signal and the input RAS signal and that arbitrates between those two signals to provide two alternative output signals: one of which is an internal-refresh selection SEL_RFSH command output signal when the RFSH input signal is given priority by the arbitration and selection circuit and the other of which is an external-address selection SEL_RAS command output signal when the RAS input signal is given priority by the arbitration and selection circuit. Each DRAM block has a corresponding wordline decoder that receives multi-bit row-line address input signals and that also receives a wordline-decoder control signal to provide row-access select output signals to corresponding row access signal lines. Each DRAM block has a corresponding wordline address multiplexer that provides either internally-provided refresh wordline input address signals REF_ADDR to the wordline decoder or externally-provided row-line address signals to the wordline decoder. Each DRAM block has a refresh counter subsystem that includes a refresh counter that is selected to provide internal refresh address signals and that includes a counter-enable latch circuit for holding a token status signal, wherein the counter-enable latch circuits for all of the DRAM blocks are serially connected together for serial passing of the token status signal a corresponding adjacent counter-enable latch circuits and wherein a refresh counter that has the token status signal is enabled to be sequentially incremented by a series of SEL_RFSH signals to sequentially provide the internal refresh counter internal wordline address REF_ADDR signals to a corresponding wordline address multiplexer. Each refresh counter has associated with it an enable flip-flop which serves both to enable the local counting and to enable refresh of the associated array such that only one counter is incremented at any given time and only one memory array is refreshed in response to a refresh request. Each DRAM block has a local block control circuit that is selectively activated in either an internally generated refresh mode or in an external-address mode, both of which modes provide control signals for selecting and enabling a corresponding DRAM block and for initiating a timing chain for the corresponding DRAM block. The external-address mode is activated by both the SEL_RAS signal and an external address signal for a corresponding DRAM array; and the internally generated refresh mode is activated by the SEL_RFSH signal for a refresh counter whose counter-enable latch circuit holds the token status signal Internal refreshing of the DRAM blocks of memory cells according to the present invention requires no additional external signals for internally refreshing the DRAM blocks.

For the DRAM system with two or more DRAM arrays, the associated enable flip-flops are so connected such that once a given counter completes its count, a subsequent enable flip-flop is set to thereby a subsequent counter and such that the enable flip-flop for the current counter is cleared to thereby prevent the current counter from further counting until its enable flip-flop is subsequently set. Each refresh counter subsystem includes a detector circuit that detects that the refresh counter has reached a predetermined count and that generates a control signal which passes a token status signal to an adjacent refresh counter-enable latch circuit to enable that adjacent refresh counter. Each local block control circuit generates a finish pulse that is fed to the arbitration and control circuit to generate another SEL__RFSH signal or a SEL__RAS signal for a RFSH signal or a RAS signal that was not previously given priority. The self-refresh internal oscillator circuit provides a periodic internal self-refresh (RFSH) output signal for the DRAM system at a frequency that provides refreshing of the DRAM memory cells as required by the leakage characteristics of the DRAM memory cells. The arbitration and selection circuit provides that: if a refresh operation is in progress and a row access RAS command is initiated, the row access operation is delayed until the refresh operation is completed; if a row access operation is in progress and a refresh request occurs, the refresh is delayed until the row access is completed; and if both a row access and a refresh occur effectively simultaneously, the row access operation is given priority and the refresh operation is scheduled to begin upon completion of the row access operation. The refresh request signal RFSH is asynchronous with respect to a row access RAS command that occur in response to an external write or read access command. The arbitration and selection circuit receives the RFSH signal and the input RAS signal and arbitrates between those two signals to provide two output signals: one of which is an internal-refresh selection SEL__RFSH command output signal when the RFSH input signal is given priority by the arbitration and selection circuit and the other of which is an external-address selection SEL__RAS command output signal when the RAS input signal is given priority by the arbitration and selection circuit.

A method is provided according to the present invention for internally refreshing memory cells of a DRAM array. The method includes receiving a row line select signal that refreshes DRAM memory cells in the word row of the DRAM array; receiving a multi-bit row-line address at a wordline decoder that provides row-line select signals to corresponding row access signal lines of the DRAM array; providing internally-provided refresh wordline input address signals to the wordline decoder through a wordline address multiplexer that receives a mux control signal, said wordline address multiplexer otherwise providing externally-provided row-line address signals to the wordline decoder; providing an internal self-refresh RFSH output signal with a self refresh internal oscillator circuit; receiving a row access select RAS input signal for the DRAM array; receiving the RFSH signal and an input RAS signal with an arbitration and selection circuit that provides a refresh selection SEL__RFSH command output signal to initiate an internal memory-cell refresh cycle when the RFSH input signal is selected and given priority by the arbitration and selection circuit and that provides a RAS selection SEL__RAS command output signal to initiate a read or write memory-cell cycle when the RAS input signal is selected and given priority by the arbitration and selection circuit; activating a memory array timing circuit that is activated by the SEL__RFSH signal or the RAS signal to provide enable signals for the DRAM array and the wordline decoder, said memory array timing circuit also providing the mux control signal to the wordline address multiplexer to select the internal refresh counter internal wordline address signals; and incrementing a refresh counter that is incremented by the SEL__RFSH signal and that provides the internal refresh counter internal wordline address signals REF__ADDR signals to the wordline address multiplexer; whereby internal refreshing of the DRAM memory cells requires no additional external control signals for internally refreshing the DRAM array.

The method includes providing a plurality of arrays of DRAM memory cells where each array has an associated refresh counter and where only one such associated refresh counter is active during a given refresh cycle for the DRAM system.

An arbitration and control system is provided for a DRAM memory device that has a SRAM interface. This system includes control circuitry for self refresh operations. An address transition detector includes an address stable timer that provides a delayed control signal that allows arbitration latch metastability to be resolved. A refresh latch is provided to hold a refresh request and an external access latch is provided to hold a pending external RAS cycle request. The control system starts either an refresh cycle or an external RAS cycle first and, after the termination of that cycle, executes the other cycle. Timers are provided to properly tailor the durations of the refresh and external RAS access signals to the characteristics of a particular DRAM type.

An arbitration and control system for a self-refresh DRAM includes an address transition detection (atd) block, a refresh control block, and an external-access RAS control block. The address transition detection block receives an address transition signal a__in and provides an addr__stable output signal to indicate that an address transition has occurred and that a new address is stable. A refresh control block is provided that receives a refresh request signal ref__req signal, the addr__stable signal, and a row-address-select xras__time1__b signal and that provides a ref__time__b output signal that initiates an internal refresh of a DRAM row. A RAS control block is provided that receives the addr__stable signal and the ref__time__b signal and that provides a row-address-select xras__time1__b output signal which selects a DRAM row for a read or write operation. The refresh control block also includes an arbitration latch that arbitrates between the ref__req signal and the addr__stable signal. The arbitration latch is set in response to the ref__req signal to provide the ref__time1__b output signal. The arbitration latch is reset by the addr__stable signal.

A metastable condition of the arbitration circuit, that is caused by close arrival of the ref__req signal and the addr__stable signal, is resolved with the transition detector block including a delay circuit that delays the effect of the addr__stable signal until a metastable condition in the arbitration circuit is resolved. The address transition detection block does not provide an output signal unless a write-enable we or a chip enable ce signal is received by the address transition detection block.

An idle control block provides an output signal when the xras__time1__b signal is inactive and provides no output signal when the addr__stable signal is active to thereby inhibit the ref__time__b output signal and to prevent initiation of an internal refresh of a DRAM row. A 35 input AND function receives an output signal from the arbitration latch, the output signal from the idle control block 726, and the xras__time1__b signal such that the output signal of the 3-input AND function triggers a timer circuit that provides the ref__time__b signal.

The refresh control block includes a flip-flop circuit that is set by the ref_req signal and reset by the ref_time_b output signal to hold a refresh request. A refresh timer circuit provides a predetermined active pulse width to the ref_time1_b signal to properly time the refresh access duration. The RAS control block includes a RAS flip-flop circuit that is set by the addr_stable signal and that is reset by the xras_time1_b signal to hold an external RAS cycle request and wherein the RAS flip-flop circuit has an output signal that is gated through a two-input AND gate with an inactive ref_time_b signal. A RAS timer circuit provides a predetermined active pulse width to the sras_time1_b signal to properly time the duration of an external access to the DRAM memory device.

BRIEF DESCRIPTION OF THE DRAWINGS

The accompanying drawings, which are incorporated in and form a part of this specification, illustrate embodiments of the invention and, together with the description, serve to explain the principles of the invention:

FIG. 1 is a block diagram illustrating a generic prior art refresh scheme for asynchronous and synchronous DRAMs that requires the use of external signals to activate an internal memory-cell refresh operation.

FIG. 2 is a block diagram illustrating a DRAM refresh system for a single DRAM memory array according to the present invention.

FIG. 3 is a block diagram illustrating an embodiment of a DRAM refresh system according to the present invention for two DRAM memory arrays.

FIG. 4 is a circuit diagram of an arbitration and selection control circuit for use in FIG. 3.

FIG. 5 is a circuit diagram of a refresh counter with an enable circuit for each of the two DRAM arrays shown in FIG. 3.

FIG. 6 is a circuit diagram of a local block control circuit for one of the DRAM arrays of FIG. 3.

FIG. 7 is a circuit diagram of a local block control circuit for another of the DRAM arrays of FIG. 3.

FIG. 8 is a timing diagram illustrating the function of the selection control circuit of FIG. 4 for various sequences of RAS and RFSH.

FIG. 9 is a timing diagram illustrating that a RAS assertion and a RFSH assertion occurring at effectively the same time results in the order of the cycles depending on the detailed timing and delays of the circuit.

FIG. 10 is a timing diagram illustrating that a RFSH asserted during a series of RAS assertions results in refresh cycle being properly scheduled.

FIG. 11 is a timing diagram illustrating that as the FRSH assertion time moves toward the end of the series of RAS assertions it will be scheduled after the completion of all the RAS cycles, but within a predetermined period of time.

FIG. 12 is a diagram illustrating an embodiment of the present invention for four DRAM arrays.

FIG. 13 is a timing waveform diagram illustrating the waveforms of the counter outputs of FIG. 12 in standby.

FIGS. 14, 15, 16, 17 are timing diagrams illustrating in more detail a count sequence propagating to the next counter and cycles from the last counter back to the first counter for the system of FIG. 10.

FIG. 18 is a block diagram illustrating an alternative arbitration and control circuit that has an address transition detection block, a refresh control block, and a RAS control block.

FIG. 19 is a timing diagram illustrating signals associated with the address transition detection block of FIG. 18.

FIG. 20 is a block diagram of the refresh control block of FIG. 18.

FIG. 21 is a circuit diagram of a shift register latch used in the refresh control circuit of FIG. 20.

FIG. 22 is a block diagram of a RAS control block of FIG. 18.

FIG. 23 is a timing diagram illustrating an internal refresh request given priority over an external address change.

FIG. 24 is a timing diagram illustrating an external address change given priority over an internal refresh request.

FIG. 25 is a circuit diagram of a timer circuit used in FIGS. 20 and 24.

FIG. 26 is a timing diagram illustrating metastable behavior in a latch circuit

DETAILED DESCRIPTION OF THE PREFERRED EMBODIMENTS

Reference is now made in detail to preferred embodiments of the invention, examples of which is illustrated in the accompanying drawings. While the invention is described in conjunction with the preferred embodiments, it will be understood that they not intended to limit the invention to these embodiments. On the contrary, the invention is intended to cover alternatives, modifications and equivalents, which may be included within the spirit and scope of the invention as defined by the appended claims.

FIG. 2 illustrates a DRAM system 110 that provides refreshing for a single DRAM array 112 that is arranged as rows and columns of memory cells. While a single DRAM array 112 is shown, it is understood that in a conventional DRAM chip there are typically several arrays of DRAM memory cells and these DRAM arrays are arranged as a set of several banks of memory cells. Refreshing, of DRAMs with multiple banks are described herein below in connection with other embodiments of the invention. Individual rows of the single-bank DRAM array 112 are selected with a corresponding wordline, or row select, address signal that is provided on one of a plurality of wordline signals that are provided on a wordline bus 114. Refreshing of the memory cells in a wordline is automatic, as known in the DRAM art. DRAMs are constructed such that whenever a row of a DRAM is addressed, the memory storage cells in that row are refreshed regardless of whether the row addressing is intended for a READ, A WRITE, or a REFRESH operation. The present invention modifies and improves upon prior art DRAM refresh schemes, as typically shown in FIG. 1, by eliminating the need to use separate external signals or special sequences of external signals to initiate internal refreshing of the DRAM. The wordline signals on the wordline bus 114 are provided from a decoder/wordline driver circuit 116 that is activated by a decoder control signal that is provided on a control line 118.

Input wordline address signals are provided for decoding to the decoder/wordline driver circuit 116 on a multi-line signal bus 120 from the output terminals of a two-input multiplexer circuit 122. Wordline address signals for the DRAM array 112 are provided to the decoder/wordline driver circuit 116 from one of two sources that is selected by the two-input multiplexer 122. For normal read or write access to a wordline of the DRAM memory cell array 112, external multi-bit input address signals are provided. For internal refreshing, internally generated multi-bit input address signals are provided. The two-input multiplexer circuit 122 selects either external address signals either from a multi-line memory address bus 124 or from internal address signals on a multi-line bus 126 from output terminals of a multi-bit refresh counter and mux control circuit 128. Selection of the output of the multiplexer 122 is controlled by a multiplexer control signal that is provided on a control line 130 from the refresh counter and mux control 128 circuit. The refresh counter keeps track of the address of the next wordline address to be used for internally refreshing the DRAM array 112.

The DRAM array 112 is enabled with an array enable signal that is provided on a signal line 132. For reading out memory data stored in one of the memory cells in the DRAM array 112, a sense amplifier/read-write circuit 134 is used to detect the charge level in that one of the memory cells to provide output data on a bidirectional I/O bus 138. Input data is read into one of the memory cells of the array 112 from the bidirectional I/O bus 138. The sense amplifier/read-write circuit 134 is controlled by a memory read-write control signal on a control line 136 to turn on sense amplifiers.

A wordline-address selection and memory-array timing control circuit 140 provides local timing chain signals for accessing and operating the DRAM array 112. The circuit 140 provides a decoder control signal on the control line 118 to the decoder/wordline driver circuit 116. The circuit 140 also provides an array-enable signal on the signal line 132 to the DRAM array 112. The 140 further provides a memory read-write control signal on the control line 136 to the sense amplifier/read-write circuit 134.

The DRAM memory system 110 according to the present invention includes an internal self-refresh oscillator 150 that is always active. The output signal of the self-refresh oscillator 150 is a refresh RFSH signal that is provided on a signal line 152 to the wordline-address selection and memory-array timing control circuit 140. The RFSH signal is intended to provide continuous internal refreshing unless a row access select RAS signal is received. The wordline-address selection and memory-array timing control circuit 140 also receives a RAS signal on a signal line 154 from a RAS input terminal 156.

The wordline-address selection and memory-array timing control circuit 140 arbitrates between the RFSH input signal and the RAS input signal. Depending on the arbitration results, if the RAS signal gets priority, normal row access operation is provided so that external address signals are provided to the DRAM array 112 from the multi-line memory address bus 124. If the RFSH signal gets priority, a select refresh mode SEL_RFSH signal is provided on a signal line 148 from the wordline-address selection and memory-array-timing circuit 140 to the refresh counter and mux control circuit 128. The SEL-RFSH signal also puts a multiplexer control signal on the control line 130 for the two-input multiplexer circuit 122 to select an internal refresh address signals on the multi-line bus 126 from the multi-bit refresh counter 128. At the end of the refresh cycle, the refresh counter 128 is incremented to the next internal refresh memory location.

FIG. 3 is a block diagram illustrating an embodiment of a SRAM refresh system that is used for a DRAM system 200 with two DRAM arrays, or blocks 202, 204. Typically, a DRAM has two or more DRAM arrays, or blocks. In FIG. 3, a wordline address selection function is separated from a memory-array timing control function. The wordline-address selection and memory-array timing control circuit 140 of FIG. 2 has been partitioned into a wordline address selection control circuit 210 and a pair of local memory-block control circuits 212, 214, one for each DRAM array. The local block control circuit 212 generates local timing chain signals for a first DRAM array 202. The second local block control circuit 214 generates local timing chain signals for a second DRAM array 204. Each of the DRAM blocks 202, 204 has a separate, respective refresh counter with enable circuits 220, 222 for keeping track of the wordlines that are internally refreshed.

The arbitration and selection control circuit 210 generates and distributes a minimal set of signals, consisting of SEL_RFSH and SEL_RAS to provide internal refreshing or data addressing for a selected DRAM array.

Similar to the single DRAM array 112 of FIG. 2, the DRAM array 202 has a sense amplifier/read-write circuit 230, a decoder/wordline driver circuit 232, a two-input multiplexer circuit 234, and the refresh counter with enable circuit 220.

Individual rows of the DRAM array 202 are selected with a corresponding wordline signal that is provided on one of a plurality of wordlines that are provided on a wordline bus 240 from the decoder/wordline driver circuit 232 that is activated by a decoder control signal that is provided on a control line 242 from the local block control circuit 212. The address signals for the wordline signals are inputted to the decoder/wordline driver circuit 232 from one of two sources that are selected by the two-input multiplexer 234. Input signals are provided to the decoder/wordline driver circuit 232 on a multi-line signal bus 244 from the output terminals of the two-input multiplexer circuit 234. The two-input multiplexer circuit 234 selects either external address signals from a multi-line external memory address bus 250 or internal address signals from a multi-line internal memory bus 252 connected to output terminals of the multi-bit counter with enable circuit 220. Selection of the output of the multiplexer 234 is controlled by a multiplexer control signal called MUX-REF-b that is provided on a control line 254 from the refresh counter with enable circuit 220.

The DRAM cell array 202 is enabled with an array enable signal that is provided on a signal line 260 from the local block control circuit 212. When enabled, with a token status signal, the refresh counter 220 keeps track of the address for the next wordline to be refreshed in the DRAM cell array 202. The sense amplifier/read-write circuit 230 is controlled by a memory read-write control signal on a control line 262 from the local block control circuit 212 to turn on sense amplifiers. For reading out memory data stored in one of the memory cells in the array 202, a sense amplifier is used to detect the charge level in that one of the memory cells to provide output data on an I/O bus 264. Input data is read into one of the memory cells of the array 202 from the I/O bus 264.

The local block control circuit 212 provides local timing chain signals for accessing the DRAM array 202, including: the decoder control signal on control line 242 to the decoder/wordline driver circuit 232, the array-enable signal on the signal line 260 to the DRAM array 202, and the memory read-write control signal on the control line 262 to the sense amplifier/read-write circuit 230.

To initiate a normal read or write memory access operation, or memory cycle, for the DRAM array 202, the local block control circuit 212 receives two signals. One of these signals is a signal on a signal line 266 from the multi-line external memory address bus 250. This signal is a selected address bit that selects the DRAM array 202. The other signal is a select RAS (SEL-RAS) signal on a signal line 268 from the arbitration and selection control circuit 210. After a normal memory access operation, the local block control circuit 212 generates a cycle-finish pulse signal on a control line 270 that is logically combined in an OR gate 272 with a similar signal on another control line 273 for the DRAM array 204. The output of the OR gate 204 is fed back to the arbitration and selection control circuit 210 to signal cycle completion.

Similar to the DRAM array 202, the DRAM array 204 has associated therewith the local block control circuit 214, a sense amplifier/read-write circuit 214, a decoder/wordline driver circuit 276, a two-input multiplexer circuit 278, and the refresh counter with enable circuit 222. The various circuits associated with the sense amplifier/read-write circuit 274 function similarly to the various circuits associated with the DRAM array 202, as described herein above. A signal on a signal line 278 of the multi-line external memory address bus 250 is a selected address bit that selects the DRAM array 204.

The two refresh counter with enable circuits 220, 222 are connected by signal busses 280, 282 that provide for holding and passing of a token status signal between these two circuits so that only one counter at a time is activated.

The DRAM memory system 200 according to the present invention also includes a self-refresh oscillator 284 that is always active and that provides a refresh (RFSH) output signal on a signal line 285 to the arbitration and selection control circuit 210. Unless a RAS signal is received at a RAS terminal 286 that is connected to an input terminal of the arbitration and selection control circuit 210, the arbitration and selection control circuit 210 provides SEL-RFSH output signals on a signal line 287. The SEL_RFSH signal activates the one of the counters with enable circuits 220, 222 that has possession of the token status signal. The activated one of the refresh counters 220, 222 provides for internal, serial refreshing of the associated one of the DRAM arrays 202, 204 of the DRAM system 200. The operation of the refresh counter with enable circuits 220, 222 and their interaction is described herein below in connection with FIG. 5.

The arbitration and selection control circuit 210 arbitrates between a RFSH input signal and a RAS input signal. Depending on the arbitration results, if the RAS signal has priority, a select RAS SEL-RAS signal is internally provided on the signal line 268 to the local block control circuits 212, 214 to initiate normal row access operation of the respective DRAM arrays 202, 204. If the RFSH signal has priority, a select refresh mode SEL_RFSH signal is provided the signal line 287 to the one of the refresh counter with enable circuits 220, 222 that has the activation token.

FIG. 4 shows an arbitration and selection control circuit 300 similar to the arbitration and selection control circuit 162 of FIG. 3. All of the flip flops (FF) of FIG. 4 are initially reset on power up. A RAS input terminal 302 is connected to a clock input terminal of a RAS-FF that is a D flip-flop that has its D input terminal connected to a HIGH (VCC) voltage level. A RFSH input terminal 306 is connected to a clock input terminal of another D flip-flop, REF-FF 308, which also has its D input terminal connected to a HIGH (VCC) voltage level. Input signals RAS and RFSH are asynchronous with respect to each another and have no predetermined mutual timing relationship. Both are asserted as logical HIGH levels. A positive-going edge of either signal latches a logical HIGH (VCC) level into a respective associated flip-flop, RAS_FF 304 or REF_FF 308, to provide respective Q output signals RAS_Q or REF_Q, as indicated.

A positive-going edge on the signal RAS or RFSH also trigger respective pulse generators 310, 312 to generate respective output pulses RAS_P and REF_P, which are logically combined in a NOR gate 314 to provide one input signal to a two-input NAND gate 316, the output of which clocks a refresh-active D flip-flop ACT_FF 318. The Q output signal of a refresh-active flip-flop ACT_FF 318 provides an ACTIV signal on a signal line 320. The signal line 320 is connected to a clock input terminal of a selection D flip-flop SEL_FF 322 which is triggered on the positive-going edge of the ACTIV signal. The signal line 320 is also connected to one input terminal of a two-input AND gate 324. The other input terminal of the two-input AND gate 324 is connected to the inverted Q output terminal of the SEF-FF 322.

If the RAS input signal goes to a HIGH level when the arbitration and selection control circuit 300 is in the quiescent state, the RAS_FF 304 provides a Q output signal RAS_Q to the D input terminal of the selection D flip-flop SEL_FF 322 so that the ACTIV signal on line 320 clocks the RAS_Q HIGH level into SEL_FF 322 to provide a Q output signal SEL RAS at a SEL RAS terminal 326.

On the other hand, if the RFSH signal goes to a HIGH level when the selection control circuit 300 is in the quiescent state, the ACTIV signal on line 320 will clock a LOW RAS_Q signal into the Q output of SEL_FF 322 to keep the output SEL_RAS signal LOW. The HIGH ACTIV signal combines with the HIGH inverted Q signal of SEL_FF 322 to cause an output SEL_RFSH signal from the AND gate 324 to go HIGH at a SEL_RFSH output terminal 328.

When a memory access cycle for the DRAM array is complete, typically, about the time of sensing, a FINISH pulse is provided at a FINISH input terminal 330 that is connected to a reset terminal of the ACT_FF 318 flip-flop and the SEL-FF 422.

The FINISH pulse is also used with other signals to reset RAS-FF 304 and REF_FF 308. To reset the RAS_FF 304, the FINISH pulse is combined with signals SEL_RAS and ACTIV in an AND gate 332 to generate a reset signal for RAS_FF 304. Similarly, the FINISH pulse is combined with the SEL_REF signal in an AND gate 334 to generate a reset signal for REF_FF 308. Because the SEL-RAS and SEL-RFSH signals are exclusive of one another, only one of the RAS_FF 304 or the REF_FF 308, that is, whichever governs a refresh cycle just completed, is reset by the FINISH pulse. This allows the other flip-flop to queue its input request signal for subsequent execution in a refresh cycle.

The trailing falling edge of the FINISH pulse at terminal 330 triggers a pulse generator 336, which generates an output pulse that is combined in a NAND gate 338 with the output of a NAND gate 340. The input signals to the NAND gate 340 are the Q outputs RAS_Q and REF_Q. The output of the NAND gate 338 is combined in the NAND gate 264 with the output of the NOR gate 262 to produce a clock input signal to flip-flop ACT_FF 266. Thus, if a RAS_Q or REF_Q signal is pending at the end of the cycle, the ACT_FF 318 is clocked again to re-initiate a corresponding refresh cycle.

FIG. 5 shows a more detailed circuit diagram of an embodiment of a refresh counter with an enable circuit 400 that is used for the circuits 220, 222 shown in FIG. 3. A five-bit embodiment of a counter 402 is shown for purposes of illustration. For particular applications, the counter 402 can have any number of bits and can be either synchronous or asynchronous, as required. The number of bits corresponds to the number of wordlines for an associated DRAM array, or block. A token flip-flop FF1 404 is a D flip-flop that is used to hold a token status signal that, when present, controls activation of the refresh counter with enable circuit 400. The token flip-flop 404 and the counter 402 are both reset on power up by a power-on reset POR pulse signal provided at respective input terminals 406, 408.

Referring back to FIG. 3, the two refresh counter with enable circuits 220, 222 are shown connected by signal busses 280, 282, that provide for holding and passing of the token status signal between these two counter circuits so that only one counter at a time is activated. When several such counter with enable circuits 400 are chained together, as illustrated with the two counters 220, 222 in FIG. 3 and with four counters as described herein below in connection with FIG. 13, the first counter in the chain uses a preset D flip-flop 404 instead of a reset flip-flop as shown. For example, with reference to FIG. 3, upon power up the first flip-flop is set and its associated local block control circuit 214 is enabled for an internal refresh operation.

With reference back to FIG. 5, an internal refresh selection SEL-RFSH input terminal 410 is connected through an inverter 412 to one input of a 2-input AND gate 414. The other input terminal of the 2-input AND gate 414 is connected to a Q output terminal of the token flip-flop 404. The output terminal of the 2-input AND gate 414 is connected to a clock input terminal of the counter 402. The Q terminal of the token flip-flop 404 is also connected to an input terminal of a two-input NAND gate 416. The other input terminal of the two-input NAND gate 416 is connected to the SEL-RFSH input terminal 410. When the signal SEL_RFSH is asserted, an output signal, MUX_REF_b, at an output terminal 418 of the two-input NAND gate 416 which goes LOW to select an associated MUX 234 or 278 in FIG. 3. The Q terminal of the flip-flop 404 is connected to an EN-OUT terminal 420 at which is provided a counter enable output signal that indicates that the token flip-flop 404 has possession of the token status and that its associated counter 402 can be incremented to provide internal refresh address signals for an associated DRAM array.

Five bit output terminals of the five-bit counter 402 are connected through a five-line bus 422 to the terminals of a 5-bit output port 424. When the counter 402 is active, it provides the five bits of an internal refresh address REF_ADDR. The REF_ADDR signals are supplied to a corresponding one of the associated muxes 234 or 278 in FIG. 3.

A five-input NAND gate 430 has its input terminals connected through the five-line bus 422 to the output terminals of the counter 402. The counter 402 is incremented when the SEL_RFSH signal is de-asserted by going to a LOW state. When the counter 402 reaches a full count of all HIGH levels at its output terminals, the five-input NAND gate 430 provides a LOW-going output signal to an input terminal of pulse generator circuit 432. When an input signal to the pulse generator circuit 432 goes to a HIGH level, the pulse generator circuit 432 generates a positive P-OUT pulse signal at a P-OUT output terminal 434.

The P_OUT output terminal 434 is connected through a signal line to one input terminal of a two-input OR gate 438. The other input terminal of the two-input OR gate 438 is connected to a P_IN terminal 440 that receives a P-OUT signal from an adjacent counter circuit in a chain of counter circuits. The signal P_OUT clocks a signal EN_IN into the token flip-flop 404, where the signal EN_IN is the same as the EN_OUT signal of a prior counter. Thus, when the counter 402 transitions from an all 1's state (all HIGHs) to an all 0's state (all LOWs) at its output terminals, the Q output terminal of the token flip-flop of the next counter circuit is loaded with a 1 and the flip-flop 404 of the current block is loaded with a 0. The individual counter with circuits thus propagate the EN_OUT signals so that only one counter at a time is enabled such that only one DRAM block at a time has the token status signal and is enabled for refreshing its DRAM array.

Referring back to FIG. 3, shows that the MUX_REF_b signal on signal line 254 is also provided to a corresponding one of the local block control circuits 212, 214 to initiate a local timing chain. A local timing chain occurs either when either a local refresh cycle starts, as provided by signal the MUX_REF_b, or when a local access starts as provided by signal SEL_RAS along with local decoding of part of the ADDRESS signals received on signal busses 266, 278. The timing chain generates signals as required for array access. The timing chain is well known by those familiar with the DRAM art. At the end of the timing chain the sense amp is enabled and at or shortly before or after this time a signal is generated on line 270 to signal the completion of the access to the arbitration and selection circuit 210.

FIGS. 6 and 7 illustrates a typical local block control circuits 500, 502 that provides output control signals for use with one of the DRAM arrays 202, 204 of FIG. 3. With reference to FIG. 6, at a first input terminal 504 is provided an address-bit input signal a_1 and at another input terminal 506 is provided another address-bit input signal a_1. These signals are two address-bit signals coming in on the external address bus 250 of FIG. 3. All of the address bits are not needed to be used and these two address signals are used in this example to illustrate the concept. For the case of two DRAM arrays, such as shown in FIG. 3, FIG. 6 illustrates that only the one signal a_0 is needed to select between the 2 DRAM arrays of FIG. 3. With reference to FIG. 7, FIG. 7 is the same as FIG. 6 except that the a_0 input signal is inverted in an inverter 508 to select the other DRAM array. The input address-bit signal a_1 at terminal 506 is used to select a subwordline within the DRAM array where a subwordline encompasses bit lines less than the full width of a wordline. In this example, only two subwordlines are provided within each DRAM array for illustration purposes.

In a larger system the input addresses are predecoded and two predecode address signals are fed to the local block control circuit and logically AND'd to form the equivalent of the a_0 signal. Alternatively, a final decode block is used to generate a single decoded address signal which is fed into the local block control circuit. Similarly, for the subwordline decoding, either predecode signals are fed to the local block control circuit or fully decoded signals are generated in a separate block.

The RFSH and RAS inputs at input terminals 510, 512, are OR'd logically with each other and AND'd with the a_0 signal to generate the decode_drive en signal at terminal 514 which enables the decoder and wordline driver blocks 232, 276 in FIG. 3. The second address line, a_1, is used to generate two signals, which select a subwordline in the DRAM array. These signals are dram_sub_w1_1 and dram_sub_w1_2 at terminals 516, 518. These signals are fed to the DRAM array.

A first delay block, DELAY_1 520 generates the sense_enable signal, which is fed to the sense amps on line 262, for example, to enable sensing space. Sensing must be suitably delayed after driving the wordline and subwordline in order to allow the signal on bitlines to develop to a sufficient level prior to sensing.

A second delay block, DELAY_2 522 generates signal sig_121 provided on line 270 of FIG. 3 some time after sensing is enabled. This signal, sig_121, mimics the time required for the sense amplifiers to sense and generate a suitable output signal on their outputs. It is returned to the arbitration and selection control block, 210 via the OR gate 272, and serves as a sense completion indicator to the arbitration and selection control block 210.

FIG. 7 is similar to FIG. 6 and illustrates a local block control circuit for the other one of the DRAM arrays of FIG. 3.

FIGS. 8, 9, 10, and 11 are timing diagrams that illustrate simulated test operation of the arbitration and selection control circuit 300 of FIG. 4 for various sequences of RAS and RFSH input signals designated as test.RAS and as test.refresh. The timing diagrams also show the simulated reset signal POR designated as test.POR and output select signals SEL-RAS and SEL-RFSH designated as ras_cycle and refresh_cycle. With reference to the first set of RAS and RFSH signals in FIG. 8, two input RAS signals asserted in succession and separated by a specified time result in selection of two SEL_RAS signals in succession. More than two successive RAS input signal assertions result in a similar number of SEL_RAS signals in succession.

The next set of RAS and RFSH input signals show that two RFSH input signals asserted in succession and separated by a specified time result in selection of two SEL_RFSH signals in succession. The same is true of more than two RFSH assertions. The next set of RAS and RFSH input signals shows that a RAS assertion followed by a RFSH assertion results in a SEL_RAS cycle followed by a refresh cycle. A RFSH assertion followed by a RAS assertion results in a refresh cycle followed by a SEL_RAS cycle. A RAS assertion and a RFSH assertion occurring at nearly the same time results in a SEL_RAS cycle and in a SEL_RFSH cycle where the order of the cycles depends on the detailed timing and delays of the circuit. However, both cycles complete in a predetermined period of time.

FIG. 9 shows on an expanded time scale that a RAS assertion and a RFSH assertion occurring at nearly the same time result in an order for SEL_RAS and SEL_RFSH cycles that depends on the detailed timing and delays of the circuit.

FIG. 10 further illustrates that a RFSH signal asserted during a series of RAS signal assertions results in SEL_RFSH cycle that is properly scheduled between SEL_RAS cycles.

FIG. 11 is similar to FIG. 10 and shows that as the RFSH assertion time moves toward the end of the series of RAS assertions, a corresponding SEL_RFSH signal is scheduled after the completion of all the RAS cycles, but within a predetermined period of time.

FIG. 12 illustrates an embodiment of a SRAM refresh system 300 that is an expansion of the SRAM refresh system of FIG. 3 and that has four DRAM arrays 602, 604, 606, 608. A wordline address selection control circuit 610 receives a RAS input signal from a RAS input terminal 612. An asynchronous refresh oscillator circuit 614 provides a refresh RFSH output signal on a signal line 616 to the wordline address selection control circuit 310. The wordline address selection control circuit 610 arbitrates between the RAS input signal and the RFSH input signal to select a SEL_RRSH on a signal line 618 or a SEL_RAS signal on a signal line 620. The SEL-RFSH signal is intended to provide continuous internal refreshing unless a RAS signal is received at a RAS terminal 612. External addresses for the DRAMs are provided at an input port 622.

Each of the four DRAM arrays 602, 604, 606, 608 has a respective refresh counter with enable circuit 622, 624, 626, 628; a respective mux circuit 632, 634, 636, 638; a respective block control circuit 642, 644, 646, 648; a respective decoder and word line driver circuit 653, 654, 656, 658; and a respective sense amp 662, 664, 666, 668. The P_OUT to P_IN connections between the various refresh counter with enable circuits are provide with respective signal lines 672, 675, 676, 678. All of the respective circuits for each of the DRAM arrays 602, 604, 606, 608 are connected similar to the connections of the two DRAM arrangement of FIG. 3.

FIG. 13 shows that a minimum of signal activity occurs during refresh since only the SEL_REF signal is supplied to each of the counters 622, 624, 626, 628 and only one of these counters is active during any refresh cycle. By partitioning the entire memory into a plurality of DRAM arrays the number of wordlines per array is reduced so that the size of each counter is reduced, which results in low power consumption.

Also shown in FIG. 13 are the respective Q outputs of the flip-flops 404 of FIG. 5 that are associated with each respective one of the four counters 622, 624, 626, 628 of FIG. 12. Only one of these four counters is HIGH at a given time. Each of the respective Q output signals of the flip-flops 254 of FIG. 5 enables its associated counter for counting SEL_RFSH signals. Each of the respective Q output signals of the flip-flops 404 of FIG. 5 enables an associated respective block control circuit 642, 644, 646, 648 for a refresh operation.

FIGS. 14–17 illustrates the waveforms of the first output bit of each of the refresh counters of FIG. 12 during successive refreshes that occur when the system is in standby mode and only refresh accesses are executing.

FIG. 18 illustrates an alternative arbitration and control subsystem 700 having a typical address transition detection block 702. The arbitration and control subsystem 700 also includes a refresh control block 704 and a RAS control block 706 according to the present invention.

FIG. 18 shows that the address transition detection block 702 has input terminals for receiving a power-on reset (por) signal, a write-enable (we) signal, a chip-enable (ce) signal, and an address-input (a_in) signal. An external access occurs whenever the address-input a_in signal changes state (either from LOW to HIGH or from HIGH to LOW) and whenever the we signal or the ce signal changes state from an unasserted (LOW) state to an asserted (HIGH) state. When an external access occurs, the address transition detection block 702 generates output signals called an address-stable (addr_stable) output signal and an address detection det_a_buf signal. Note that typically the a_in signal does not change state unless ce is asserted. The address detection det_a_buf signal is a short pulse indicating that an address transition has taken place. The addr_stable signal is a longer pulse indicating that an address transition has occurred and that the address is stable. If another address transition occurs while the addr_stable signal is being asserted, the duration of the addr_stable pulse signal is extended.

FIG. 19 is a timing diagram illustrating the address detection det_a_buf and addr_stable pulse signals for various frequency of changes in the a_in signal. The timing diagram shows positive pulses for det_a_buf signals and negative pulses for addr_stable signals. For each change in the a_in signal, that is, for each positive-going or negative-going edge of a_in, a separate det_a_buf pulse is generated. FIG. 19 illustrates that for a series of two or more rapid address changes, the addr_stable pulse is stretched accordingly.

With reference to FIG. 18, the refresh control block 704 has input terminals for receiving a power-on reset (por) signal, a refresh request (ref_req) signal, the addr_stable signal from the address transition detection block 702, and an xras_time_1_b output signal from the RAS control block 706. The input refresh request ref_req input signal is generated by an oscillator and is asserted to indicate that a refresh access is required. The refresh control block 704 generates a ref_time_b output signal.

FIG. 20 shows in more detail the refresh control block 704. The ref_req signal is fed to an input terminal of a pulse generator 710 that is triggered on a positive edge to provide an output refresh start pulse ref_strt_p to a set input terminal of an RS flip-flop circuit 712. A first reset input terminal of the RS flip-flop circuit 712 receives a ref_time_b input signal that is fed back from an output terminal of a refresh timer circuit 714 at the output terminal of the refresh control block 704. A second reset input terminal of the RS flip-flop circuit 712 receives the power-on reset por signal. The q output terminal of the RS flip-flop 712 has an output signal rq_ff that is applied to one input terminal of an arbitration latch 716. The addr_stable input signal for the address for the address transition detection circuit 702 of FIG. 1 is applied to the other input terminal of the arbitration latch 716. The output terminal of the arbitration latch 716 is applied through two inverters 718, 720 to provide a refresh acknowledge ref ack_out signal that is applied to one input terminal of a 3-input NAND gate 722. The NAND gate 722 has an output terminal that is connected through an inverter 724 to provide an AND function.

The addr_stable input signal is also applied to a first input terminal of an idle control block 726. The xras_time1_b output signal of the RAS CONTROL block 706 is applied to a second input terminal of the idle control block. The por signal is also applied to an input terminal of the idle control block 726. An active-low output signal en_set_ref of the idle control block 726 is applied to a third input terminal of the 3-input NAND gate 722.

The output signal set_ref_rq of the AND function provided by the 3_input NAND gate 722 and the inverter 724 is applied to an input terminal of the timer 714 to provide a ref_time_b output signal that starts a refresh access cycle.

The RS flip-flop circuit 712 is set whenever the ref_req signal goes HIGH and is reset by the ref_time_b signal at the start of execution of a refresh access. The RS flip-flop stores a refresh request and provides a HIGH level at its output terminal until the start of execution of a refresh access. Storage of the refresh request is initiated with the pulse generator 710. Reset of the RS flip-flop is accomplished when the ref_time_b signal goes LOW at the start of a refresh access cycle.

The arbitration latch 716 arbitrates between a refresh cycle request and an external access cycle request. Its output signals r_rq and ad_edge are normally LOW because the rq_ff input signal is normally LOW and the addr_stable input signal is normally HIGH.

An inverter 730 inverts a power-on_reset signal por into an inverted por_b signal. The inverted por_b signal resets the circuits 712 and 726. The por signal resets circuit 714.

FIG. 21 is a circuit diagram of the shift register arbitration latch 716 used in the refresh control circuit of FIG. 20. The arbitration latch 716 has two 2-input cross-coupled NAND gates 750, 752. The rq_ff signal is provided to one input terminal of the NAND gate 750. The other input terminal of the 2-input NAND gate 750 is couple to the output terminal of the NAND gate 752. The addr_stable signal is provided through an inverter 758 to one input terminal of the NAND gate 752. The other input terminal of the NAND gate 752 is couple to the output terminal of the NAND gate 750. The output signal of the NAND gate 750 is passed through an inverter 754 to provide the r_rq signal. The output signal of the NAND gate 752 is passed through an inverter 756 to provide an ad_edge signal. When the addr_stable signal goes LOW to indicate an external access, the ad_edge signal goes HIGH so that this state of the arbitration latch 716 prevents the r_rq output signal from going HIGH if the input rq_ff signal subsequently goes HIGH.

With reference back to FIG. 20, the addr_stable signal is also fed into the idle-control block 726, such that, when the addr_stable signal goes LOW, the output signal en-set-ref of the idle_control block 726 is reset LOW to thereby disable propagation of the ref_ack_out signal through the AND gate formed by the NAND gate 722 and the inverter 724. As a result, any address change that causes the addr_stable signal to go LOW to indicate an external access effectively blocks any refresh cycle from occurring until the addr_stable signal times out and goes back HIGH. Note that the rising edge of the addr_stable signal starts an external access cycle using the RAS control block 706 of FIG. 18.

With reference to FIG. 22, the rising edge of the addr_stable signal triggers the pulse generator 760 to start an external access cycle with the RAS control block 706. At the end of the external access cycle xras_time1_b goes from LOW to HIGH. This causes the idle_control block 726 of the Refresh Control block 704 in FIG. 20 to set its output signal en_set_ref back to a HIGH to thereby enable starting a refresh operation at the end of an external access cycle.

FIG. 22 shows the details of the RAS control block 706 of FIG. 18. The addr_stable signal is fed to an input terminal of a pulse generator 760 that is triggered on a positive edge to provide an output pulse to one input terminal of a 3-input NAND gate. The xras_time1_b output signal of the RAS control block 706 is fed back to a second input terminal of the 3-input NAND gate 762. The third input terminal of the 3-input NAND gate also receives the power-on reset por signal. The por signal is inverted in an inverter 790 to provide an inverted por_b signal. The fed back xras_time1_b signal is also passed through an inverter 764 to an input terminal of a positive-edge triggered pulse generator 766 that has an output signal rs_xr_rq_b that is fed to a reset input terminal of a RS flip-flop 768. The set input terminal of the flip-flop 768 is connected through an inverter 770 from the output terminal of the 3-input NAND gate 762. The 3-input NAND gate 762 and the inverter 770 form an AND gate. The output signal of the RS flip-flop 768 is fed through two inverters 772, 774 to one input terminal of a 2-input NAND gate. The other input terminal of the 2-input NAND gate 776 receives the ref_time_b signal from the Refresh Control block of FIG. 20. The output terminal of the 2-input NAND gate 776 is connected to an input terminal of an inverter 778 that provides an AND function in combination with the NAND gate 776. The output signal of the inverter 778 is fed to an input terminal of a positive-edge triggered pulse generator 780 to provide a xras_p output signal to an input terminal of a RAS timer circuit 782. The output signal of the ras_timer circuit 782 is fed through two inverters to provide the xras_time1_b output signal for the RAS control block 706. As previously described, the xras_time1_b signal is fed back to an input terminal of the 3-input NAND gate 762 and also to an input terminal of the inverter 764. Circuit 768 is reset by the por_b signal. Circuit 782 is reset by the por signal.

The refresh request and the addr_stable for signals occur asynchronously with respect to each other. If the adddr_ stable signal state occurs, or goes LOW, prior to the receipt of the ref_req signal such that the signal ad_edge of FIG. 20 goes HIGH, an external RAS cycle is executed with the circuit of FIG. 20. This occurs when the active LOW state of the addr_stable signal times out and goes HIGH to eventually trigger the xras_time_1b output signal to be asserted as a LOW level. During this time the refresh cycle provided by FIG. 20 is disabled. When the external RAS cycle ends, as indicated by the xras_time_b signal going HIGH, the en_set_ref signal of FIG. 20 goes HIGH. Since the addr_stable signal has gone HIGH, the r_rq signal is set and the signal set_ref_rq is generated to start the timer 714 such that the signal ref_time_b goes LOW to execute a refresh cycle.

Corresponding waveforms are shown in FIG. 23. A change in the address signals is indicated by a_in and write enable is active LOW so that the addr_stable signal is generated prior to ref_req. The xras_time1_b signal gives active LOW and after it times out and goes HIGH, the ref_time_b signal is generated.

If the ref_req signal occurs prior to the addr_stable signal going LOW, such that the rq_ff signal occurs prior to addr_stable going LOW, the r_rq signal is set and the set_ref_rq signal is generated. This starts the timer 714 and generates the ref_time1_b signal which goes LOW to execute a refresh cycle. The ref_time_b signal is fed into the RAS control block 706 as shown in FIG. 18 and FIG. 22.

The ref_time_b signal blocks transmission through the AND gate function provided by NAND gate 776 and inverter 778 to prevent generation of the xras_time1_b signal as illustrated in the detailed circuit of the RAS CONTROL block 706 of FIG. 22. Since generation of the xras_time1_b is not started until the addr_stable signal times out and goes HIGH, sufficient time is allowed for the ref_time_b signal to block the xras_time1_b signal. FIG. 22 also shows that, when the addr_stable signal goes HIGH, the RS flip-flop 768 is set so that the xr_rq signal goes HIGH. When the refresh cycle ends, the ref_time_b signal goes HIGH, the sel_xras signal is generated to start the ras_timer 782. This generates the xras_time1_b signal and executes an external access RAS cycle.

Waveforms showing this are shown in FIG. 24. The ref_req signal goes active HIGH prior to the addr_stable signal going LOW so that the ref_time_b signal goes active LOW first. In this case, subsequently, xras time1_b goes active LOW.

FIGS. 23 and 24 illustrate the basic operation of the arbitration and control circuit according to the invention.

FIG. 25 shows a timer circuit 800 that is used for the refresh timer 714 of FIG. 20 that has a respective input signal set_ref_rq and a respective output signal ref_time_b. The timer circuit 800 is also used for the RAS timer 782 of FIG. 22 that has a respective input signal xras_p and a respective output signal xa_dela.

The timer circuit 800 includes a pair of CMOS inverters 802, 804 that form a latch that has an output terminal of the inverter 802 connected to an input terminal of the inverter 804 and that has an output terminal of the inverter 804 connected to an input terminal of the inverter 802. The output signal lat_1 of the inverter 802 is the latch output signal and is fed through an inverter to an output terminal out_1.

An input signals in_1 is fed through an inverter 806 to provide an inverted input signal in_1_b. The input signal is also fed to a gate terminal of a NMOS transistor 808 that has its source terminal connected to a ground reference voltage. The drain terminal of the NMOS transistor 808 is connected to the input terminal of the inverter 802, the output terminal of the inverter 804, and the drain terminals of a first parallel PMOS transistor 810 and a second PMOS transistor 812. The PMOS transistors 810, 812 have their source terminals both connected to a positive reference voltage. The gate terminal of the PMOS transistor 812 is fed through an inverter 814 with the power-on reset signal por. The gate terminal of the PMOS transistor 810 is fed with a rs_lat_b signal from a source described herein below.

The output terminal of the latch is connected through an inverter 816 to a gate terminal of a first series PMOS pullup transistor 818. The source terminal of the first series PMOS pullup transistor 818 is connected to a drain terminal of a second series PMOS pullup transistor 820. The source terminal of the second series PMOS pullup transistor 820 is connected to the positive reference voltage. The gate terminal of the second series PMOS pullup transistor 820 is fed with a signal p_2. A drain terminal of the first series PMOS pullup transistor 818 is connected to a mock_1 node 822. The mock_1 node is connected to a drain terminal of a NMOS pulldown transistor 824 that has a source terminal connected to the ground reference voltage. A gate terminal of the NMOS pulldown transistor 824 is connected to an output terminal of a 2-input NAND gate 824. One input terminal of the a 2-input NAND gate 826 is fed with the in_1_b signal and the other input terminal of the 2-input NAND gate 824 is fed with the lat_1 signal. A pair of capacitor-connected NMOS transistors 828, 830 are connected between the mock_1 terminal 822 and the ground reference voltage. The mock_1 signal is also applied to the input gates of a CMOS inverter circuit formed with a NMOS transistor 832 and a PMOS transistor 834. The output signal end_b of the CMOS inverter 832, 834 is coupled through two series connected inverters 836, 838 to provide a rs_lat_b signal that is fed to the gate of the PMOS transistor 810.

When a respective input signal in_1 goes HIGH, the latch 802, 804 changes state and the output signal lat_1 goes HIGH which causes the mock_1 node 822 to charge up through the PMOS transistors 818 and 820 as soon as in_1 goes LOW (the signal in_1 is a HIGH pulse). When the signal level at node mock1 is sufficiently HIGH, the signal rs_at_b goes LOW and resets the latch 802, 804, making signal lat_1 go LOW and discharging the node mock1. The output signal out_1 is asserted LOW and has a duration which is set by adjusting the sizes of PMOS transistors 818, 820 and the sizes of the NMOS transistors 828, 830.

With reference to FIGS. 25, 20, and 26, it is possible that the timing of the signals ref_req and addr_stable are such that a narrow pulse is generated for the set-ref_req signal and that the latch 802, 804 inside the timer block enters a metastable state for some period of time. Such a metastable state resolves itself and the time to do so is dependent on the characteristics of the latch and loading on its nodes. The probability that the latch will resolve itself to a known state is made as large as desired by extending the time allowed for resolution. For practical applications, this time should not be so large as to impact operation significantly. For example, in 0.18 micron technology, 7 nanoseconds is considered sufficient time for the latch to resolve itself. If more time is needed, the LOW going pulse duration can be extended.

FIG. 26 illustrates waveforms when a narrow set_ref_rq pulse causes the latch 802, 804 within the timer to be metastable. The metastability is resolved just before the addr_stable sign goes HIGH.

The basic control circuit for the invention uses very little circuitry and provides an SRAM refresh implementation that is both area efficient and low powered. To further reduce power consumption, memory cell arrays are preferable kept small, with short bitlines and with short wordlines. In contrast to conventional DRAMs where the number of wordlines and cells per wordline are governed by a conventional 2 k or 4 k refresh, the invention organizes the arrays such that the number of wordlines and cells per wordline results in a reduced power during an individual cycle as well as in reduced power in refresh only mode (standby mode). For example, in a conventional 16M DRAM with 4 k refresh, all 16M cells must be refreshed within a 64 ms interval consisting of 4096 refresh cycles. This requires each refresh access to open 16M/4096=4096 cells which means there are effectively 4096 cells per wordline. In the architecture disclosed by the invention the number of cells per wordline is reduced resulting in less instantaneous power required per row access. The number of cells per bitline is also reduced resulting in less overall power consumption for refresh.

The DRAM memory is preferable organized as several memory arrays with each memory array having a reduced set of wordlines and with each memory array having its own refresh address counter. Several refresh address counters are coupled by a common signal to a refresh control circuit. By reducing the number of signal lines provided to the local refresh counters, signal activity and hence instantaneous power is reduced.

Summary operation of the arbitration and control circuits described in connection with FIGS. 18–26 is as follows: The address transition detection (atd) circuit 702 generates the addr_stable signal which indicates the start of an external access. A refresh request ref_req signal indicates the start of a refresh access. These two signals are fed to an arbitration latch circuit 716 that serves as an arbitration circuit for selecting one of these signals. Subsequent to any atd signal, a delay timer circuit internal to the atd circuit 702 is triggered such that any external access is delayed until the delay time expires and the active-LOW addr_stable signal provides a positive-going edge to set the external access request latch 768. The length of the delay is made sufficiently long so that any metastable states associated with the arbitration latch have sufficient time to be resolved. Metastable states may result when the two input signals to the arbitration latch 716 arrive at almost the same time.

It is also significant that the invention holds a refresh request to allow a refresh cycle to occur at the end of any external read or write cycle. A refresh request latch 712 hold the refresh request until it is actually executed. A external access request latch 768 holds the external access request until is executed. An idle latch 726 is set at the end of an external cycle to enable a refresh operation.

The foregoing descriptions of specific embodiments of the present invention have been presented for purposes of illustration and description. They are not intended to be exhaustive or to limit the invention to the precise forms disclosed, and obviously many modifications and variations are possible in light of the above teaching. The embodiments were chosen and described in order to best explain the principles of the invention and its practical application, to thereby enable others skilled in the art to best utilize the invention and various embodiments with various modifications as are suited to the particular use contemplated. It is intended that the scope of the invention be defined by the claims appended hereto and their equivalents.

We claim:

1. A DRAM system with internal refreshing of dynamic memory cells, comprising:
   a self-refresh internal oscillator circuit that provides an internal self-refresh (RFSH) output signal for the DRAM system;
   a RAS input terminal for receiving an input row access select (RAS) signals for reading from or writing to memory cells of the DRAM system;
   an arbitration and selection control circuit that receives the RFSH signal and the input RAS signal and that arbitrates between those two signals to provide two alternative output signals: one of which is an internal-refresh selection SEL_RFSH command output signal when the RFSH input signal is given priority by the arbitration and selection circuit and the other of which is an external-address selection SEL_RAS command output signal when the RAS input signal is given priority by the arbitration and selection circuit;
   two or more DRAM blocks of memory cells, each DRAM block arranged in word rows and each of said word rows having a row-access signal line for receiving a row-access select signal that causes DRAM memory cells in a corresponding word row to be addressed and refreshed;
   each DRAM block having a corresponding wordline decoder that receives multi-bit row-line address input signals and that also receives a wordline-decoder control signal to provide row-access select output signals to corresponding row-access signal lines;
   each DRAM block having a corresponding wordline address multiplexer that provides either internally-provided refresh wordline input address signals REF_ADDR to the wordline decoder or externally-provided row-line address signals to the wordline decoder.

2. The DRAM system of claim 1 wherein the two or more DRAM blocks of memory cells are organized such that instantaneous power consumption for a refresh cycle is controlled by the number of memory cells accessed by each wordline:
   each DRAM block having a refresh counter subsystem that includes a refresh counter that is selected to provide internal refresh wordline address signals and that also includes respective counter-enable latch circuits for holding a token status signal that enables a respective refresh counter, wherein the counter-enable latch circuits for all of the DRAM blocks are serially connected together for serial passing of the token status signal to corresponding adjacent counter-enable latch circuits and wherein a refresh counter that has the token status signal is enabled to be sequentially incremented by a series of SEL_RFSH signals to sequentially provide the internal refresh wordline address REF_ADDR signals to a corresponding wordline address multiplexers;
   such that only one refresh counter at a time is incremented and only one memory array is refreshed in response to a RFSH signal;
   each DRAM block having a local block control circuit that is selectively activated in either an internally generated refresh mode or in an external-address mode, both of which modes provide control signals for selecting and enabling a corresponding DRAM block and for initiating a timing chain for the corresponding DRAM block;
   wherein the external-address mode is activated by both the SEL_RAS signal and an external address signal for a corresponding DRAM array and wherein the internally generated refresh mode is activated by the SEL__RFSH signal for the particular refresh counter whose counter-enable latch circuit holds the token status signal; and whereby internal refreshing of the DRAM blocks of memory cells require no additional external control signals for internally refreshing the DRAM blocks.

3. The DRAM system of claim 1 wherein the counter-enable latch circuits are so connected that once a given counter completes its count, a subsequent counter-enable latch circuit is set to thereby enable the subsequent counter and wherein the counter-enable latch circuit for the current counter is cleared to thereby prevent the current counter from further counting until its counter-enable latch circuit is subsequently set.

4. The DRAM system of claim 1 wherein each refresh counter subsystem includes a detector circuit that detects that the refresh counter has reached a predetermined count and that generates a control signal which passes a token status signal to an adjacent counter-enable latch circuit to enable that adjacent refresh counter.

5. THE DRAM system of claim 1 wherein each local block control circuit generates a finish pulse that is fed to the arbitration and control circuit to produce another SEL__RFSH signal or a SEL__RAS signal for a RFSH signal or a RAS signal that was not previously given priority.

6. The DRAM system of claim 1 wherein the self-refresh internal oscillator circuit provides a periodic internal self-refresh (RFSH) output signal for the DRAM system at a frequency that provides refreshing of the DRAM memory cells as required by the leakage characteristics of the DRAM memory cells.

7. The DRAM system of claim 1 wherein internal refresh cycles are internally scheduled for completion within a predetermined period of time while performing arbitrary write or read access cycles.

8. The DRAM system of claim 5 wherein write or read cycles are scheduled for completion within a predetermined period of time while performing internal refresh cycles.

9. The DRAM system of claim 1 wherein the arbitration and selection circuit provides that: if a refresh operation is in progress and a row access RAS command is initiated, the row access operation is delayed until the refresh operation is completed; if a row access operation is in progress and a refresh request occurs, the refresh is delayed until the row access is completed; and if both a row access and a refresh occur effectively simultaneously, the row access operation is given priority and the refresh operation is scheduled to begin upon completion of the row access operation.

10. The DRAM system of claim 1 wherein the refresh request signal RFSH is asynchronous with respect to a row access RAS command that occur in response to an external write or read access command.

11. A DRAM system with internal refreshing of dynamic memory cells, comprising:

said DRAM system having a self-refresh internal oscillator circuit that provides an internal self-refresh (RFSH) output signal for the DRAM system;

said DRAM system having a RAS input terminal for receiving an input row access select (RAS) signals for reading from or writing to memory cells of the DRAM system;

said DRAM system having an arbitration and selection control circuit that receives the RFSH signal and the input RAS signal and that arbitrates between those two signals to provide two output signals: one of which is an internal-refresh selection SEL__RFSH command output signal when the RFSH input signal is given priority by the arbitration and selection circuit and the other of which is an external-address selection SEL__RAS command output signal when the RAS input signal is given priority by the arbitration and selection circuit;

said DRAM system includes two or more DRAM blocks of memory cells, each DRAM block arranged in word rows and each of said word rows having a row access signal line for receiving a row-access select signal that causes DRAM memory cells in a corresponding word row to be addressed and refreshed;

each DRAM block having a corresponding wordline decoder that receives multi-bit row-line address input signals and that also receives a wordline-decoder control signal to provide row-access select output signals to corresponding row access signal lines;

each DRAM block having a corresponding wordline address multiplexer that provides either internally-provided refresh wordline input address signals REF__ADDR to the wordline decoder or externally-provided row-line address signals to the wordline decoder;

each DRAM block having a refresh counter subsystem that includes a refresh counter that is selected to provide internal refresh address signals and that also includes a respective counter-enable latch circuit for holding a token status signal, wherein the counter-enable latch circuits for all of the DRAM blocks are serially connected together for serial passing of a token status signal to a corresponding adjacent counter-enable latch circuits and wherein a refresh counter that has the token status signal is enabled to be sequentially incremented by a series of SEL__RFSH signals to sequentially provide the internal refresh wordline address REF__ADDR signals to a corresponding wordline address multiplexers, the local such that only one refresh counter at a time is incremented and only one memory array is refreshed in response to a refresh request and such that the enable flip-flops are so connected that once a given counter completes its count a subsequent enable flip-flop is set to thereby enable a subsequent counter so that the counter-enable latch circuit for a currently selected counter is cleared to thereby prevent the current counter from further counting until its counter-enable latch circuit is next set;

each DRAM block having a local block control circuit that is selectively activated in either an internally generated refresh mode or in an external-address mode, both of which modes provide control signals for selecting and enabling a corresponding DRAM block and for initiating a timing chain for the corresponding DRAM block;

wherein the external-address mode is activated by both the SEL__RAS signal and an external address signal for a corresponding DRAM array and wherein the internally generated refresh mode is activated by the SEL__RFSH signal for a particular refresh counter whose counter-enable latch circuit holds the token status signal;

wherein the arbitration and selection circuit includes a RAS__FF row address select flip-flop circuit that has a clock input terminal connected to the RAS input terminal and that has a data input terminal connected to a HIGH (VCC) voltage level; and wherein the arbitration and selection circuit includes a REF__FF reference select flip-flop circuit that has a clock input terminal connected the to the RFSH input terminal and that has a data input terminal connected to a HIGH (VCC) voltage level;

whereby internal refreshing of the DRAM blocks of memory cells require no external signals.

12. The DRAM system of claim 11 wherein the input signals RAS and RFSH are asynchronous with respect to each another with no predetermined mutual timing relationship and wherein both signals are asserted as logical HIGH levels such that a positive-going edge of either signal latches a logical HIGH level into a respective associated flip-flop, RAS__FF or REF__FF to provide respective Q output signals RAS__Q and REF__Q.

13. The DRAM system of claim 11, wherein a positive-going edge on the signal RAS or RFSH also trigger respective pulse generators to generate respective output pulses RAS__P and REF__P, which are logically combined to clock a flip-flop ACT__FF, the Q output signal of which provides an ACTIV signal that clocks a flip-flop SEL__FF to provide the SEL__RAS signal and wherein the ACTIV signal is also connected to one input terminal of a two-input AND gate 272 with the other input terminal of the two-input AND gate is connected to the inverted Q output terminal of the SEF-FF 270 to provide the SELRSH signal.

14. The DRAM system of claim 13 including a FINISH pulse that is provided to reset flip-flops SEL__FF, ACT__FF, RAS-FF, and REF__FF and because the SEL-RAS and SEL-RFSH signals are exclusive of one another, only one of the RAS__FF or the REF__FF, whichever governs a refresh or read/write cycle just completed, is reset by the FINISH pulse which allows the other flip-flop to queue its input request signal such that if a RAS__Q or REF__Q is pending at the end of the cycle, the ACT__FF is clocked again to re-initiate a refresh or read/write cycle.

15. A DRAM system with internal refreshing memory cells of a DRAM block, comprising:
- a DRAM block of memory cells arranged in word rows, each word row having a row access signal line for receiving a row-line select signal that refreshes DRAM memory cells in the word row;
- a wordline decoder that receives multi-bit row-line address signals and that provides row-line select signals to corresponding row access signal lines;
- a wordline address multiplexer that receives a mux control signal to provide either internally-provided refresh wordline input address signals to the wordline decoder, or externally-provided row-line address signals to the wordline decoder;
- a self refresh internal oscillator circuit that provides an internal self-refresh RFSH output signal;
- a RAS input terminal for receiving a row access select RAS input signal for reading from or writing to memory cells of the DRAM array;
- a wordline address selection circuit that receives the RFSH signal and the RAS input signal and that provides a refresh selection SEL__RFSH command output signal to initiate an internal memory-cell refresh cycle when the RFSH input signal is selected and given priority by the selection circuit and that other wise provides command output signals to initiate a read or write memory-cell cycle when the RAS input signal is selected and given priority;
- a memory array timing control circuit that is activated by the RFSH signal or the RAS signal to provide enable signals for the DRAM array and the wordline decoder, said memory array timing circuit also providing the mux control signal to the wordline address multiplexer to select the internal refresh counter internal wordline address signals; and
- a refresh counter that is incremented by the SEL__RFSH signal and that provides internal refresh wordline address signals REF__ADDR signals to the wordline address multiplexer;

whereby internal refreshing of the DRAM memory cells requires no additional external control signals for internally refreshing the DRAM array.

16. The DRAM system of claim 15 wherein the arbitration and selection circuit internally schedules refresh cycles for completion within a predetermined period of time while performing arbitrary write or read access cycles.

17. The DRAM system of claim 15, which internally schedules write or read cycles for completion within a predetermined period of time while performing refresh cycles.

18. The DRAM system of claim 15 including a plurality of arrays of DRAM memory cells where each array has an associated refresh counter and where only one such associated refresh counter is active during a given refresh cycle for the DRAM system.

19. A method of internally refreshing memory cells of a DRAM array, comprising:
- receiving a row-line select signal to refresh DRAM memory cells in word row of the DRAM array;
- receiving a multi-bit row-line address at a wordline decoder that provides row-line select signals to corresponding row-access signal lines of the DRAM array;
- providing internally-provided refresh wordline input address signals to the wordline decoder through a wordline address multiplexer that receives a mux control signal, said wordline address multiplexer otherwise providing externally-provided row-line address signals to the wordline decoder;
- providing an internal self-refresh RFSH output signal from a self refresh internal oscillator circuit;
- receiving a row access select RAS input signal for the DRAM array;
- receiving the RFSH signal and an input RAS signal with a wordline selection circuit that provides a refresh selection SEL__RFSH command output signal to initiate an internal memory-cell refresh cycle when the RFSH input signal is selected and given priority by the selection circuit that otherwise provides command output signals to initiate a read or write memory-cell cycle when the RAS input signal is selected and given priority;
- activating a memory array timing control circuit that is activated by the RFSH signal or the RAS signal to provide enable signals for the DRAM array and the wordline decoder, said memory array timing circuit also providing the mux control signal to the wordline address multiplexer to select the internal refresh counter internal wordline address signals; and
- incrementing a refresh counter that is incremented by the SEL__RFSH signal and that provides the internal wordline address signals REF__ADDR signals to the wordline address multiplexer;

whereby internal refreshing of the DRAM memory cells requires no additional external control signals for internally refreshing the DRAM array.

20. The method of claim 19 including internally scheduling with the arbitration and selection circuit refresh cycles for completion within a predetermined period of time while performing arbitrary write or read access cycles.

21. The method of claim 19 including internally scheduling with the arbitration and selection circuit write or read cycles for completion within a predetermined period of time while performing refresh cycles.

22. The method of claim 19 including providing a plurality of arrays of DRAM memory cells where each array has an associated refresh counter and where only one such associated refresh counter is active during a given refresh cycle for the DRAM system.

23. The method of claim 19 including controlling instantaneous power consumption per refresh cycle by controlling the size of the number of memory cells in each wordline of the DRAM blocks.

24. A method of internally refreshing dynamic memory cells of a DRAM system, comprising the steps of:

providing an internal self-refresh (RFSH) output signal for the DRAM system with a self-refresh internal oscillator circuit;

receiving an input row access select (RAS) signal for the DRAM system at a RAS input terminal;

receiving the RFSH signal and the input RAS signal with an arbitration and selection circuit and arbitrating between those two signals to provide two alternative output signals: one of which is an internal-refresh selection SEL_RFSH command output signal when the RFSH input signal is given priority by the arbitration and selection circuit and the other of which is an external-address selection SEL_RAS command output signal when the RAS input signal is given priority by the arbitration and selection circuit;

providing said DRAM system two or more DRAM blocks of memory cells, each DRAM block arranged in word rows and each of said word rows having a row access signal line for receiving a row-access select signal that causes DRAM memory cells in a corresponding word row to be addressed and refreshed;

each DRAM block having a corresponding wordline decoder for receiving multi-bit row-line address input signals and also for receiving a wordline-decoder control signal to provide row-access select output signals to corresponding row access signal lines;

each DRAM block having a corresponding wordline address multiplexer for providing either internally-provided refresh wordline input address signals REF_ADDR to the wordline decoder or externally-provided row-line address signals to the wordline decoder;

selecting a refresh counter associated with one of the DRAM blocks to provide the internal refresh wordline address signals and holding a token status signal in an associated counter-enable latch circuit for the selected refresh counter;

serially connected together counter-enable latch circuits for all of the DRAM blocks for serial passing of the token status signal to a corresponding adjacent counter-enable latch circuits and enabling a refresh counter that has the token status signal to be sequentially incremented by a series of SEL_RFSH signals to sequentially provide the internal refresh counter internal word-line address REF_ADDR signals to a corresponding wordline address multiplexer; such that only one counter is incremented at any given time and only one memory array is refreshed in response to a refresh request;

selectively activating a local block control circuit for each DRAM block that is selectively activated in either an internally generated refresh mode or in an external-address mode, both of which modes provide control signals for selecting and enabling a corresponding DRAM block and for initiating a timing chain for the corresponding DRAM block;

wherein the external-address mode is activated by both the SEL_RAS signal and an external address signal for a corresponding DRAM block and wherein the internally generated refresh mode is activated by the SEL_RFSH signal for a refresh counter whose counter-enable latch circuit holds the token status signal;

whereby internal refreshing of the DRAM blocks of memory cells require no additional external signals for internally refreshing the DRAM blocks.

25. An arbitration and control system for a self-refresh DRAM, comprising:

an address transition detection block that receives an address transition signal a_in and that provides an addr_stable output signal to indicate that an address transition has occurred and that a new address is stable;

a refresh control block that receives a refresh request signal ref_req signal, the addr_stable signal, and a row-address-select xras_time1_b signal and that provides a ref_time_b output signal that initiates an internal refresh of a DRAM row;

a RAS control block the receives the addr_stable signal and the ref_time_b signal and that provides a row-address-select xras_time1_b output signal that selects a DRAM row for a read or write operation, and wherein the refresh control block includes an arbitration latch that arbitrates between the ref_req signal and the addr_stable signal, wherein the arbitration latch is set in response to the ref_req signal to provide the ref_time1_b output signal and wherein the arbitration latch is reset by the addr_stable signal.

26. The arbitration and control system of claim 25 wherein the address transition detector block includes a delay circuit that delays the effect of the addr_stable signal until a metastable condition of the arbitration circuit, that is caused by close arrival of the ref_req signal and the addr_stable signal, is resolved.

27. The arbitration and control system of claim 25 wherein the address transition detection block does not provide an output signal unless a write-enable we or a chip enable ce signal is received by the address transition detection block.

28. The arbitration and control system of claim 25 wherein the refresh control block includes:

an idle control block that provides an output signal when the xras_time1_b signal is inactive and that provides no output signal when the addr_stable signal is active to thereby inhibit the ref_time_b output signal and to prevent initiation of an internal refresh of a DRAM row;

a 3-input AND function that receives an output signal from the arbitration latch, the output signal from the idle control block 726, and the xras_time1_b signal such that the output signal of the 3-input AND function triggers a timer circuit that provides the ref_time b signal.

29. The arbitration and control system of claim 25 wherein the refresh control block includes a flip-flop circuit that is set by the ref_req signal and reset by the ref_time_b output signal to hold a refresh request.

30. The arbitration and control system of claim 25 including a refresh timer circuit that provides a predetermined active pulse width to the ref_time1_b signal to properly time the refresh access duration.

31. The arbitration and control system of claim 25 wherein the RAS control block includes a RAS flip-flop circuit that is set by the addr_stable signal and that is reset by the xras_time1_b signal to hold an external RAS cycle request and wherein the RAS flip-flop circuit has an output signal that is gated through a two-input AND gate with an inactive ref_time_b signal.

32. The arbitration and control system of claim 31 including a RAS timer circuit that provides a predetermined active pulse width to the sras_time1_b signal to properly time the duration of an external access to the DRAM memory device.

* * * * *